US012795937B2

(12) United States Patent
Lee et al.

(10) Patent No.: US 12,795,937 B2
(45) Date of Patent: Nov. 10, 2026

(54) 3D FERROELECTRIC MEMORY DEVICES

(71) Applicant: SAMSUNG ELECTRONICS CO., LTD., Suwon-si (KR)

(72) Inventors: Kyunghwan Lee, Seoul (KR); Yongseok Kim, Suwon-si (KR); Daewon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 756 days.

(21) Appl. No.: 18/108,374

(22) Filed: Feb. 10, 2023

(65) Prior Publication Data

US 2023/0309314 A1 Sep. 28, 2023

(30) Foreign Application Priority Data

Mar. 28, 2022 (KR) ........................ 10-2022-0038183

(51) Int. Cl.

*H10B 51/20* (2023.01)
*H10B 51/10* (2023.01)
*H10D 30/69* (2025.01)
*H10D 64/68* (2025.01)

(52) U.S. Cl.

CPC ............. *H10B 51/20* (2023.02); *H10B 51/10* (2023.02); *H10D 30/701* (2025.01); *H10D 64/689* (2025.01)

(58) Field of Classification Search

CPC ........ H10B 51/20; H10B 51/10; H10B 51/30; H10B 51/40; H10B 51/50; H10D 30/701; H10D 64/689; H10D 64/033; H10D 30/0415

See application file for complete search history.

(56) References Cited

U.S. PATENT DOCUMENTS

| | | | |
|---|---|---|---|
| 9,530,794 B2 | 12/2016 | Ramaswamy et al. |
| 10,804,295 B2 | 10/2020 | Yoo et al. |
| 11,164,890 B2 | 11/2021 | Zhang et al. |
| 11,177,284 B2 | 11/2021 | Rabkin et al. |

(Continued)

FOREIGN PATENT DOCUMENTS

| | | |
|---|---|---|
| TW | 202040790 A | 11/2020 |
| TW | 202145454 A | 12/2021 |

(Continued)

OTHER PUBLICATIONS

Communication dated Jan. 3, 2024, issued by the Taiwan Intellectual Property Office in counterpart Taiwanese Application No. 112105312.

*Primary Examiner* — Shih Tsun A Chou
(74) *Attorney, Agent, or Firm* — Sughrue Mion, PLLC

(57) ABSTRACT

A three-dimensional ferroelectric random access memory (3D FeRAM) device includes: a gate electrode extending in a vertical direction on a substrate; a ferroelectric pattern and a gate insulation pattern stacked on the gate electrode in a horizontal direction to surround the gate electrode; first and second channels spaced apart from each other in the horizontal direction on an outer sidewall of the gate insulation pattern; first source/drain pattern structures spaced apart from each other in the vertical direction on an outer sidewall of the first channel; and second source/drain pattern structures spaced apart from each other in the vertical direction on an outer sidewall of the second channel.

20 Claims, 28 Drawing Sheets

(56) References Cited

U.S. PATENT DOCUMENTS

| | | | | |
|---|---|---|---|---|
| 11,411,025 | B2 * | 8/2022 | Lai | H10D 30/025 |
| 11,805,652 | B2 | 10/2023 | Wang et al. | |
| 11,839,080 | B2 | 12/2023 | Lu et al. | |
| 11,862,280 | B2 | 1/2024 | Castro et al. | |
| 11,903,223 | B2 | 2/2024 | Castro et al. | |
| 2020/0203381 | A1 * | 6/2020 | Rabkin | H10D 30/701 |
| 2020/0227525 | A1 | 7/2020 | Ji et al. | |
| 2020/0357821 | A1 * | 11/2020 | Chen | H10B 51/20 |
| 2020/0411533 | A1 | 12/2020 | Alsmeier et al. | |
| 2021/0020659 | A1 | 1/2021 | Chen | |
| 2021/0126013 | A1 | 4/2021 | Lai et al. | |
| 2021/0175252 | A1 * | 6/2021 | Han | H10D 30/63 |
| 2021/0217775 | A1 * | 7/2021 | Zhang | H10D 64/033 |
| 2021/0242241 | A1 | 8/2021 | Rajashekhar et al. | |
| 2021/0272983 | A1 | 9/2021 | Gilbert et al. | |
| 2022/0045195 | A1 | 2/2022 | Imonigie et al. | |
| 2022/0052075 | A1 | 2/2022 | Young et al. | |
| 2023/0077181 | A1 * | 3/2023 | Petti | H10D 62/115 |
| 2023/0327024 | A1 | 10/2023 | Chiang et al. | |

FOREIGN PATENT DOCUMENTS

| | | | |
|---|---|---|---|
| TW | 202145523 | A | 12/2021 |
| TW | 202201401 | A | 1/2022 |
| TW | 202205627 | A | 2/2022 |
| TW | 202205676 | A | 2/2022 |

* cited by examiner

3D FERROELECTRIC MEMORY DEVICES

CROSS-REFERENCE TO RELATED APPLICATION

This application claims priority from Korean Patent Application No. 10-2022-0038183, filed on Mar. 28, 2022 in the Korean Intellectual Property Office, the disclosure of which is incorporated herein in its entirety by reference.

BACKGROUND

Example embodiments of the inventive concept relate to a 3D ferroelectric memory device.

A ferroelectric random access memory (FeRAM) device or a ferroelectric field effect transistor (FeFET) may be used as a memory device, which is simpler than a dynamic random access memory (DRAM) device, and a non-volatile memory device as a flash memory device. Recently, a three-dimensional (3D) FeRAM device has been developed in order to have a high integration degree, however, an enhanced method of manufacturing the 3D FeRAM device is needed.

SUMMARY

Example embodiments of the disclosure provide a 3D ferroelectric memory device having an enhanced integration degree.

According to example embodiments, there is provided a 3D FeRAM device. The 3D FeRAM device may include a gate electrode, a ferroelectric pattern, a gate insulation pattern, first and second channels, first source/drain pattern structures, and second source/drain pattern structures. The gate electrode may extend in a vertical direction on a substrate. The ferroelectric pattern and the gate insulation pattern may be stacked on the gate electrode in a horizontal direction, and the ferroelectric pattern and the gate insulation pattern may surround the gate electrode. The first and second channels may be spaced apart from each other in the horizontal direction on an outer sidewall of the gate insulation pattern. The first source/drain pattern structures may be spaced apart from each other in the vertical direction on an outer sidewall of the first channel. The second source/drain pattern structures may be spaced apart from each other in the vertical direction on an outer sidewall of the second channel.

According to example embodiments, there is provided a 3D FeRAM device. The 3D FeRAM device may include a first gate electrode, a ferroelectric pattern, a second gate electrode, a gate insulation pattern, first and second channels, first source/drain pattern structures, and second source/drain pattern structures. The first gate electrode may be formed on a substrate, and may extend in a vertical direction substantially perpendicular to an upper surface of the substrate. The ferroelectric pattern, the second gate electrode and the gate insulation pattern may be sequentially stacked on the first gate electrode in a horizontal direction to surround the first gate electrode. The first and second channels may be spaced apart from each other in the horizontal direction on an outer sidewall of the gate insulation pattern. The first source/drain pattern structures may be spaced apart from each other in the vertical direction on an outer sidewall of the first channel. The second source/drain pattern structures may be spaced apart from each other in the vertical direction on an outer sidewall of the second channel.

According to example embodiments, there is a 3D FeRAM device. The 3D FeRAM device may include gate electrodes, ferroelectric patterns, gate insulation patterns, first and second channels, a first source/drain pattern structure, a second source/drain pattern structure, and a word line. The gate electrodes may be spaced apart from each other in first and second horizontal directions on a substrate. The first and second horizontal directions may cross each other. Each of the gate electrodes may extend in a vertical direction. The ferroelectric patterns may surround the gate electrodes, respectively. The gate insulation patterns may surround the ferroelectric patterns, respectively. The first and second channels may be formed on an outer sidewall of each of the gate insulation patterns, and may be spaced apart from each other in the first horizontal direction. The first source/drain pattern structure may extend in the second horizontal direction, and may include a first source/drain pattern contacting outer sidewalls of ones of the first channels arranged in the second direction, and a second source/drain pattern contacting a sidewall of the first source/drain pattern in the first horizontal direction. The second source/drain pattern structure may extend in the second horizontal direction, and may include a third source/drain pattern contacting outer sidewalls of ones of the second channels arranged in the second direction, and a fourth source/drain pattern contacting a sidewall of the third source/drain pattern in the first horizontal direction. The word line may extend in the first horizontal direction, and may be electrically connected to ones of the first gate electrodes arranged in the first direction.

In the 3D FeRAM device in accordance with example embodiments, unit cells each of which may include a pair of channels sharing one gate electrode and being spaced apart from each other in the horizontal direction may be formed, and thus the 3D FeRAM device may have an enhanced integration degree.

DETAILED DESCRIPTION OF EMBODIMENTS

The above and other features of the disclosure will be more clearly understood by describing in detail example embodiments thereof with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, in the specification (and not necessarily in the claims), two directions substantially parallel to an upper surface of a substrate and crossing each other may be defined as first and second directions D1 and D2, respectively, and a direction substantially perpendicular to the upper surface of the substrate may be defined as a third direction D3. According to an example embodiment, the first and second directions D1 and D2 may be substantially perpendicular to each other.

Figure 1:
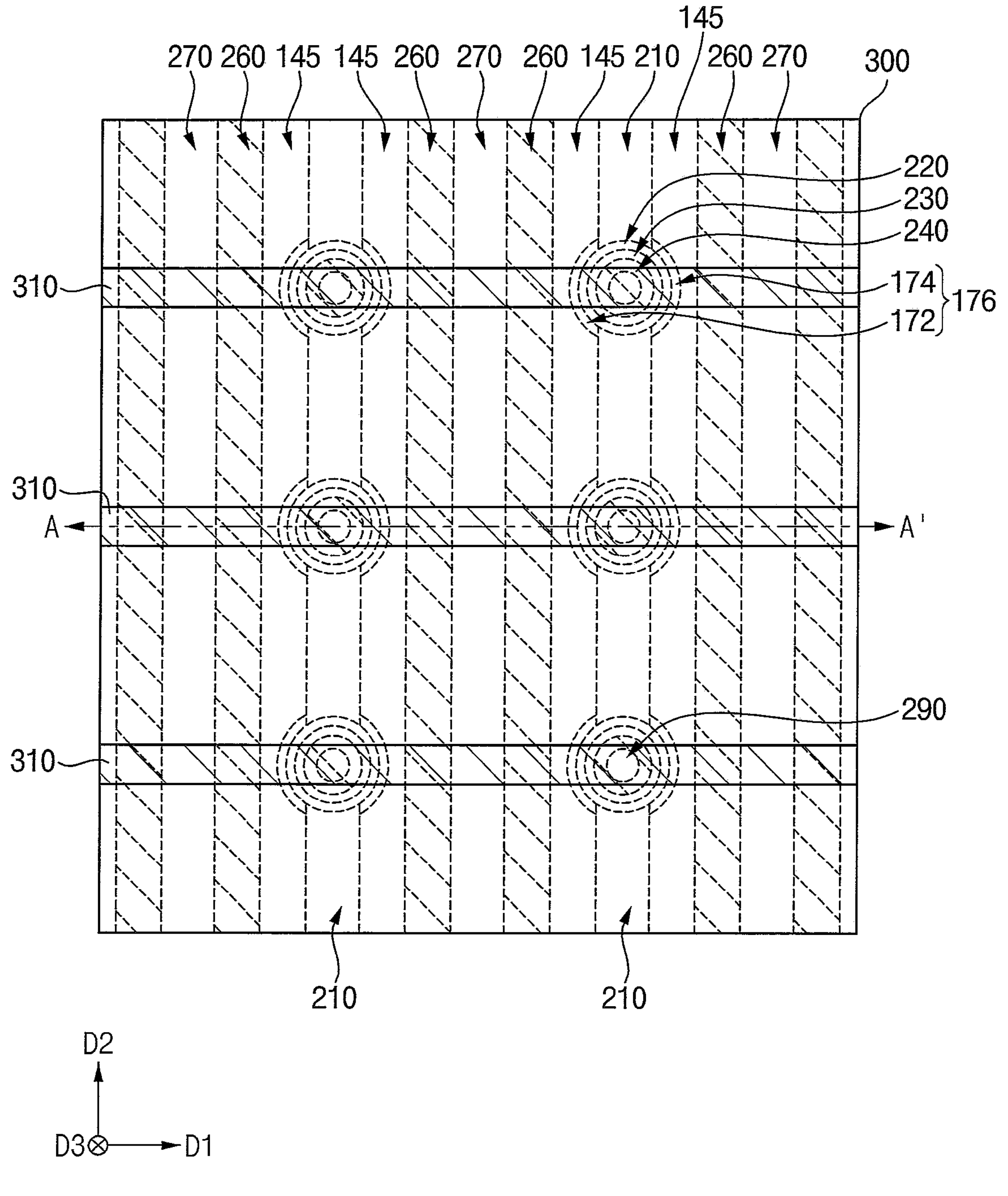
FIG. 1 is a plan view of a three-dimensional (3D) ferroelectric memory device, in accordance with an example embodiment.
Figure 2:
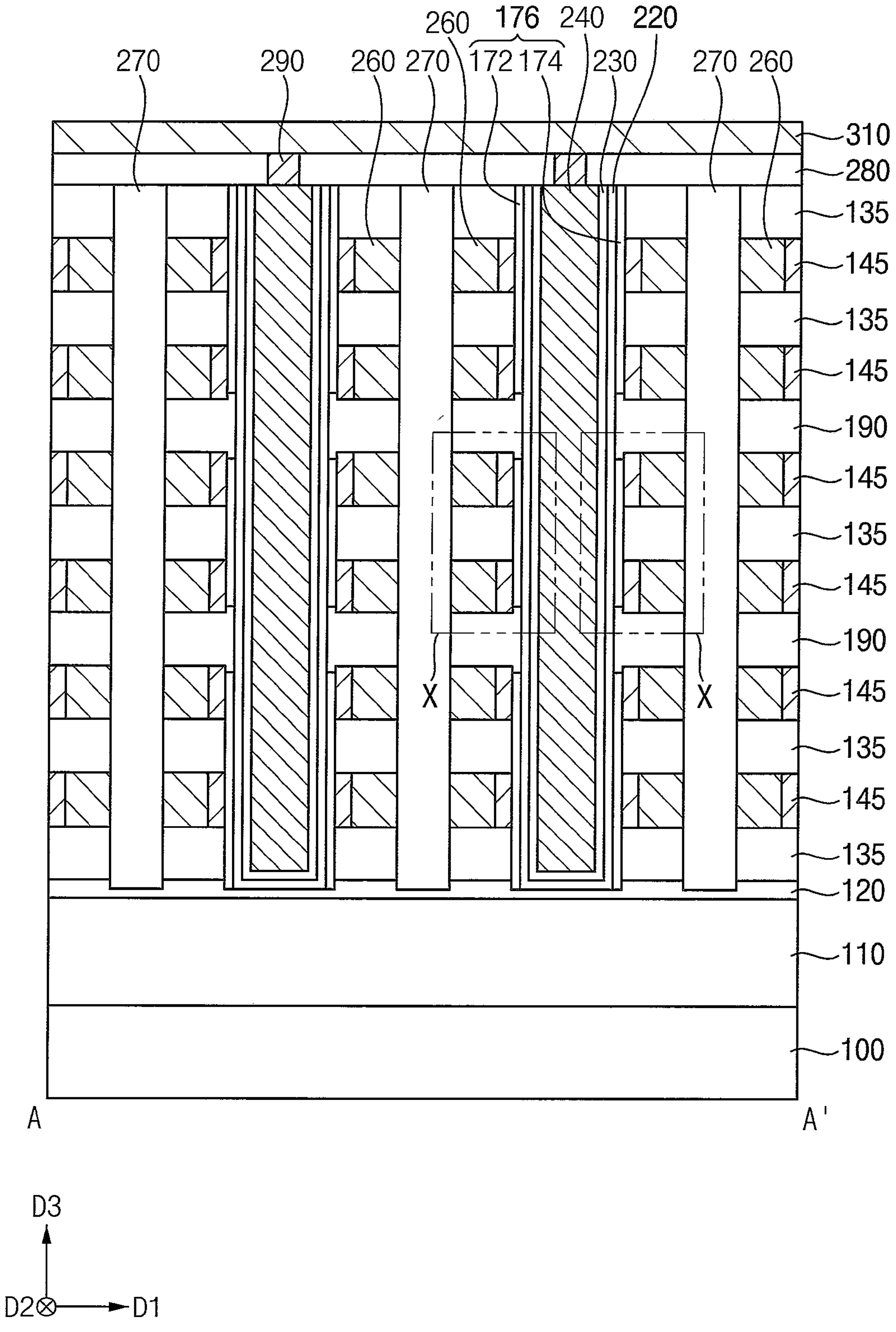
FIG. 2 is a cross-sectional view of the 3D ferroelectric memory device of FIG. 1 taken along a line A-A' shown in FIG. 1, in accordance with an embodiment.

FIG. 1 is a plan view of a three-dimensional (3D) ferroelectric memory device, in accordance with an example embodiment. FIG. 2 is a cross-sectional view of the 3D ferroelectric memory device of FIG. 1 taken along a line A-A' shown in FIG. 1, in accordance with an embodiment.

Referring to FIGS. 1 and 2, the 3D ferroelectric memory device may include a first insulating interlayer 110 and an etch stop layer 120 stacked on a first substrate 100, and a plurality of multi-layered structures may be stacked on the etch stop layer 120 in the third direction D3.

The first substrate 100 may include a semiconductor material, e.g., silicon, germanium, silicon-germanium, etc., or a III-V group compound semiconductor, such as GaP, GaAs, GaSb, etc. In an example embodiment, the first substrate 100 may be a silicon-on-insulator (SOI) substrate or a germanium-on-insulator (GOI) substrate.

The first insulating interlayer 110 may include an oxide, e.g., silicon oxide, and the etch stop layer 120 may include a metal oxide, e.g., aluminum oxide.

Various types of circuit patterns, e.g., transistors, contact plugs, wirings, etc., may be formed on the first substrate 100, which may be covered by the first insulating interlayer 110.

The multi-layered structure may include a source/drain pattern structure, a first insulation pattern 135 and another source/drain pattern structure sequentially stacked in the third direction D3. Each source/drain pattern structure may include first and second source/drain patterns 145 and 260 contacting each other in the first direction D1.

The multi-layered structure may be spaced apart from each other in the third direction D3 by a second insulation layer 190, and the first insulation pattern 135 may be further formed between a lowermost one of the multi-layered structures and the etch stop layer 120 and on the uppermost one of the multi-layered structures. FIG. 2 shows three multi-layered structures on the first substrate 100, however, the disclosure is not limited thereto.

The multi-layered structure may extend in the second direction D2, and a plurality of multi-layered structures may be spaced apart from each other in the first direction D1 by a fourth insulation layer 270. The second source/drain pattern 260 included in the multi-layered structure may extend in the second direction D2 and contact the fourth insulation layer 270, and the first source/drain pattern 145 may also extend in the second direction D2 and contact a sidewall of the second source/drain pattern 260.

According to an example embodiment, the first source/drain pattern 145 may include, e.g., polysilicon doped with n-type impurities, and the second source/drain pattern 260 may include a metal, e.g., tungsten.

The first insulation pattern 135 and the fourth insulation layer 270 may include an oxide, e.g., silicon oxide.

According to an example embodiment, a first gate electrode 240 having a pillar shape may be formed to extend in the third direction D3 through the multi-layered structures stacked in the third direction D3. According to an embodiment, a ferroelectric pattern 230 having a cup shape may be formed on a lower surface and a sidewall of the first gate electrode 240. According to an embodiment, a first gate insulation pattern 220 having a cup shape may be formed on a lower surface and an outer sidewall of the ferroelectric pattern 230. According to an embodiment, a channel structure 176 including first and second channels 172 and 174 may be formed on an outer sidewall of the first gate insulation pattern 220.

According to an example embodiment, a plurality of first gate electrodes 240 may be spaced apart from each other in the first and second directions D1 and D2, and thus, a first gate electrode array may be defined. The first gate electrode array may include a first gate electrode column including a plurality of first gate electrodes 240 arranged in the second direction D2, and a plurality of first gate electrode columns may be spaced apart from each other in the first direction D1.

According to an example embodiment, the first channels 172 on the sidewalls of the first gate insulation patterns 220 may be spaced apart from each other in the second direction D2, and the second channels 174 on the sidewalls of the first gate insulation patterns 220 may be spaced apart from each other in the second direction D2 According to an example embodiment, the first channel 172 may be divided into a plurality of first channels 172 by the second insulation layer 190 in the third direction D3, and the second channel 174 may be divided into a plurality of second channels 174 by the second insulation layer 190 in the third direction D3.

The first gate electrode 240 may include a metal, e.g., tungsten, the ferroelectric pattern 230 may include hafnium oxide doped with, e.g., zirconium (Zr), silicon (Si), aluminum (Al), yttrium (Y), gadolinium (Gd), lanthanum (La), scandium (Sc), strontium (Sr), etc., and the first gate insulation pattern 220 may include an oxide, e.g., silicon oxide.

According to an example embodiment, each of the first and second channels 172 and 174 may include a semiconductor material, e.g., polysilicon, doped polysilicon, silicon-germanium, etc. Alternatively, each of the first and second channels 172 and 174 may include an oxide semiconductor material, e.g., IGZO, Sn-IGZO, IWO, $CuS_2$, $CuSe_2$, $WSe_2$, IZO, ZTO, YZO, etc. Alternatively, each of the first and second channels 172 and 174 may include a two-dimensional (2D) material, e.g., $MoS_2$, $MoSe_2$, $WS_2$, etc.

According to an example embodiment, the first source/drain pattern 145 in the multi-layered structure may contact outer sidewalls of the first channels 172 arranged in the second direction D2. Additionally, the first source/drain pattern 145 in the multi-layered structure may contact outer sidewalls of the second channels 174 arranged in the second direction D2.

According to an example embodiment, the first source/drain pattern 145 may be divided in the first direction D1 by a third insulation layer 210 extending in the second direction D2 through the multi-layered structures stacked in the third direction D3 between neighboring ones of the first gate electrodes 240 arranged in the second direction D2. Additionally, the first channel 172 and the second channel 174 may be spaced apart from each other in the first direction D1 by the third insulation layer 210. The third insulation layer 210 may contact an outer sidewall of the first gate insulation pattern 220 on the sidewall of each of the first gate electrodes 240. The third insulation layer 210 may include an oxide, e.g., silicon oxide.

According to an example embodiment, a first contact plug 290 may be formed on an upper surface of each of the first gate electrodes 240, and a second insulating interlayer 280 may be formed on a sidewall of the first contact plug 290. Additionally, a third insulating interlayer 300 may be formed on the second insulating interlayer 280, and a first wiring 310 may extend through the third insulating interlayer 300 to contact an upper surface of the first contact plug 290.

According to an example embodiment, the first wiring 310 may extend in the first direction D1, and a plurality of first wirings 310 may be spaced apart from each other in the second direction D2. According to an example embodiment, ones of the first gate electrodes 240 arranged in the first direction D1 in the first gate electrode array may be electrically connected to the first wiring 310 through the first contact plugs 290, respectively, and may serve as a word line.

The first contact plug 290 and the first wiring 310 may include a metal, a metal nitride, a metal silicide, etc., and the second and third insulating interlayers 280 and 300 may include an oxide, e.g., silicon oxide.

According to an example embodiment, a unit cell in the 3D FeRAM device may be formed in a region X of FIG. 2.

According to an embodiment, the unit cell may include a portion of the first gate electrode 240 extending through each multi-layered structure, a portion of the ferroelectric pattern 230, a portion of the first gate insulation pattern 220 and the first channel 172 sequentially stacked in a horizontal direction substantially parallel to the upper surface of the first substrate 100, and the source/drain pattern structures contacting upper and lower portions, respectively, of the first channel 172. One of the source/drain pattern structures may serve as a source, and the other one of the source/drain pattern structures may serve as a drain.

According to an embodiment, the unit cell may include a portion of the first gate electrode 240 extending through each multi-layered structure, a portion of the ferroelectric pattern 230, a portion of the first gate insulation pattern 220 and the second channel 174 sequentially stacked in the horizontal direction, and the source/drain pattern structures contacting upper and lower portions, respectively, of the second channel 174. Again, one of the source/drain pattern structures may serve as a source, and the other one of the source/drain pattern structures may serve as a drain That is, the unit cells sharing the first gate electrode 240 and including the first and second channels 172 and 174, respectively, may face each other in the first direction D1, and thus the integration degree of the 3D FeRAM device may be enhanced.

FIGS. 3 to 16 are plan views and cross-sectional views illustrating a method of manufacturing a 3D FeRAM device, in accordance with example embodiments. Particularly, FIGS. 3, 5, 7, 9, 11, 13 and 15 are the plan views, FIGS. 4, 6, 8, 10, 14 and 16 are cross-sectional views taken along lines A-A' of corresponding plan views, respectively, and FIG. 12 is a cross-sectional view taken along a line B-B' of FIG. 11.

Figure 3:
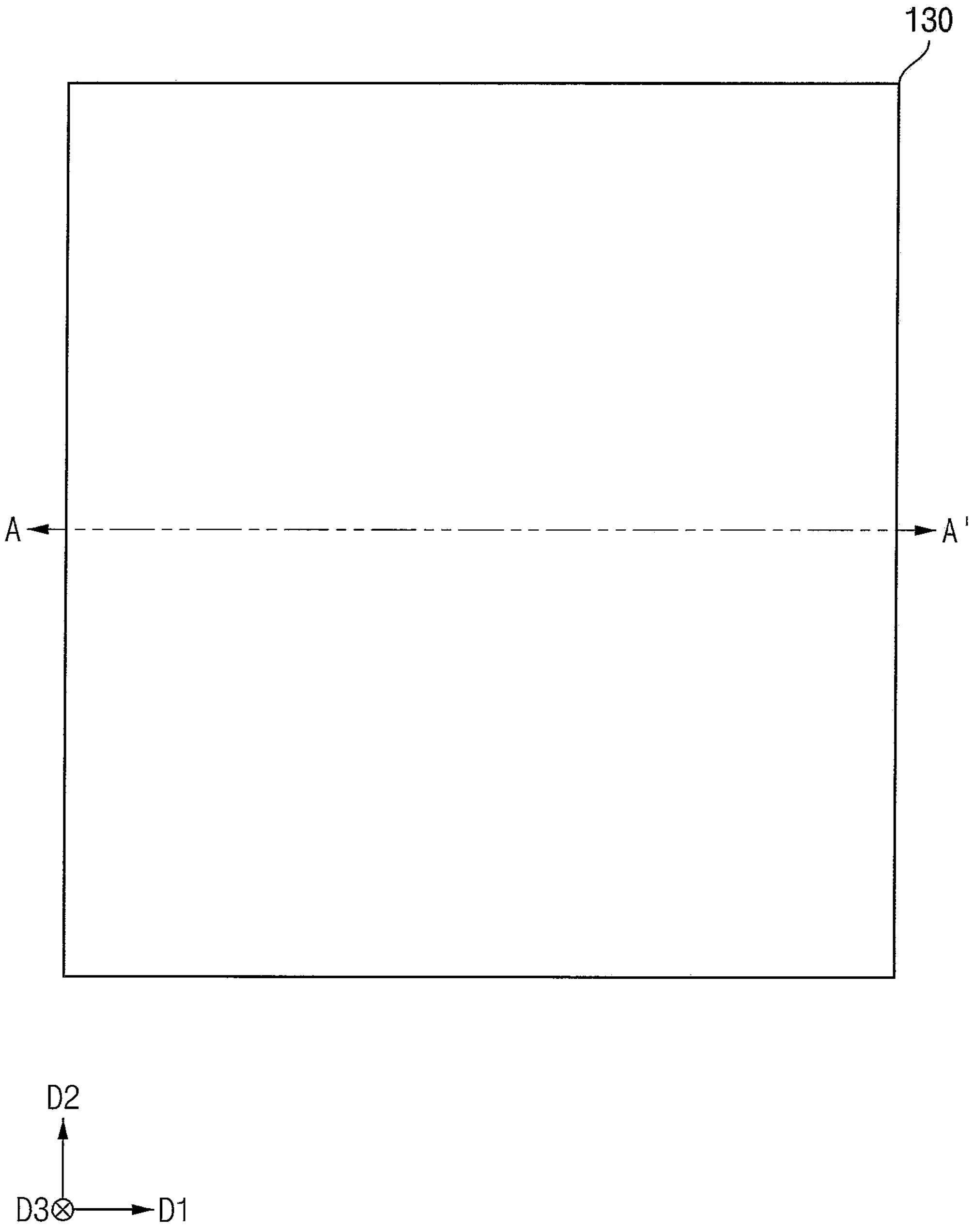
FIGS. 3 to 16 are plan views and cross-sectional views illustrating a method of manufacturing a 3D FeRAM device, in accordance with example embodiments.
Figure 4:
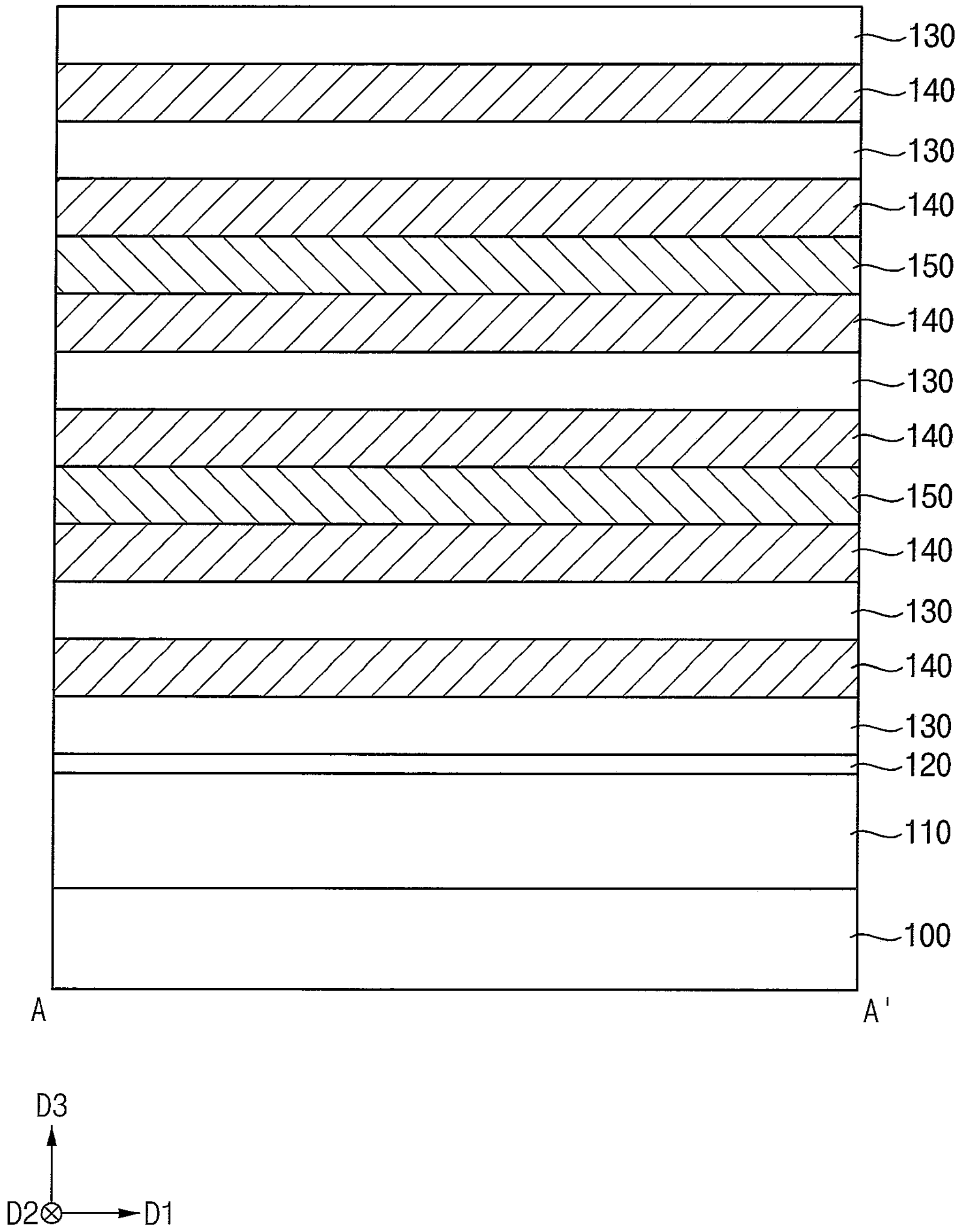

Referring to FIGS. 3 and 4, a first insulating interlayer 110, an etch stop layer 120 and a first insulation layer 130 may be sequentially stacked on a first substrate 100, a multi-layer (140/130/140) and a first sacrificial layer 150 may be alternately and repeatedly formed on the first insulation layer 130, and the first insulation layer 130 may be formed on an uppermost multi-layer.

According to an example embodiment, the multi-layer may include a first source/drain layer 140, the first insulation layer 130 and another first source/drain layer 140 sequentially stacked in the third direction D3.

The first sacrificial layer 150 may include a material having an etching selectivity with respect to the first insulation layer 130. For example, the first sacrificial layer 150 may include an insulating nitride such as silicon nitride.

FIG. 4 shows three multi-layers stacked on the first substrate 100, however, the disclosure may not be limited thereto, and a plurality of multi-layers may be stacked on the first substrate 100.

Various types of circuit patterns, e.g., transistors, contact plugs, wirings, etc., may be formed on the first substrate 100, on which the first insulating interlayer 110 may be formed.

Figure 5:
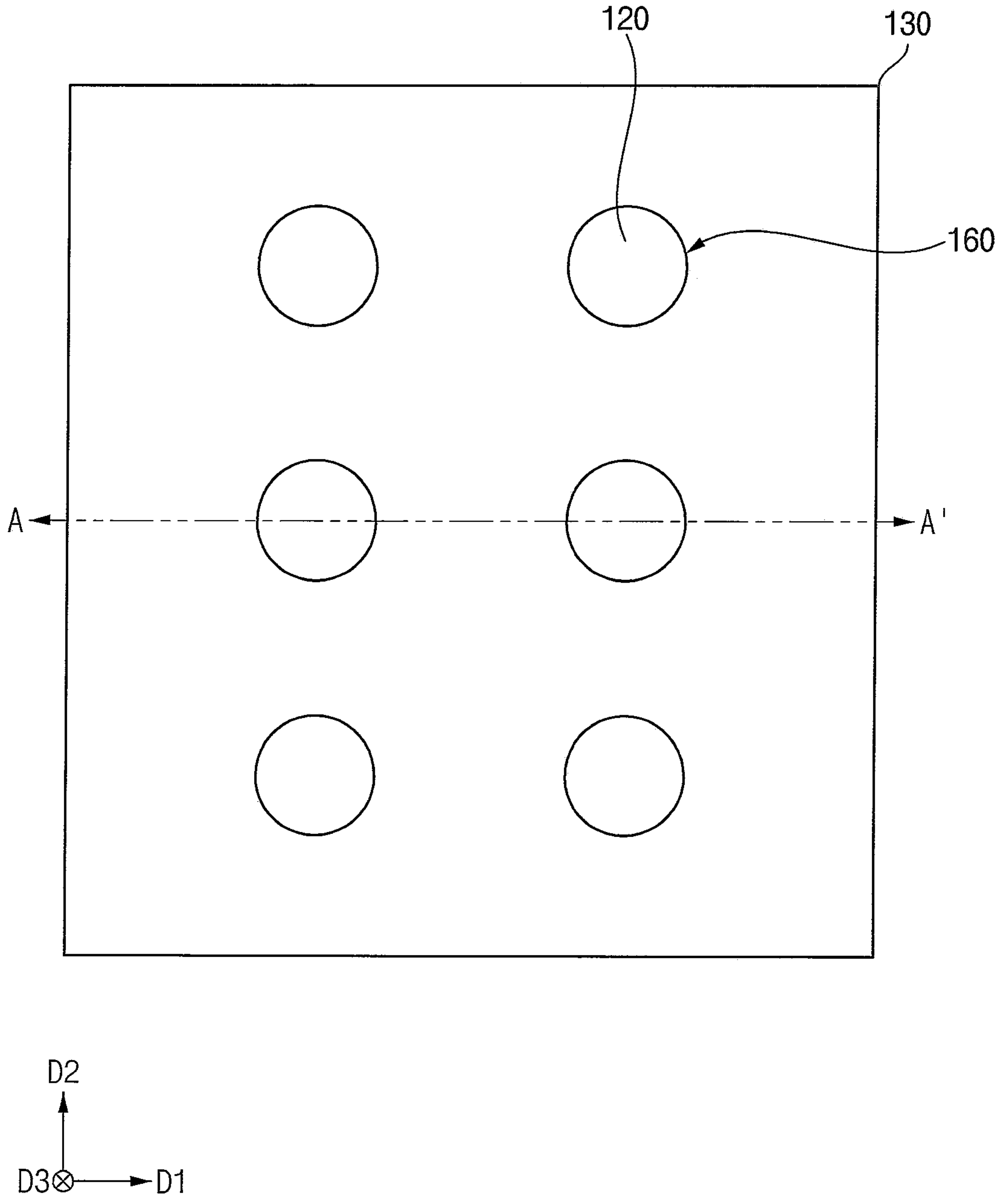
Figure 6:
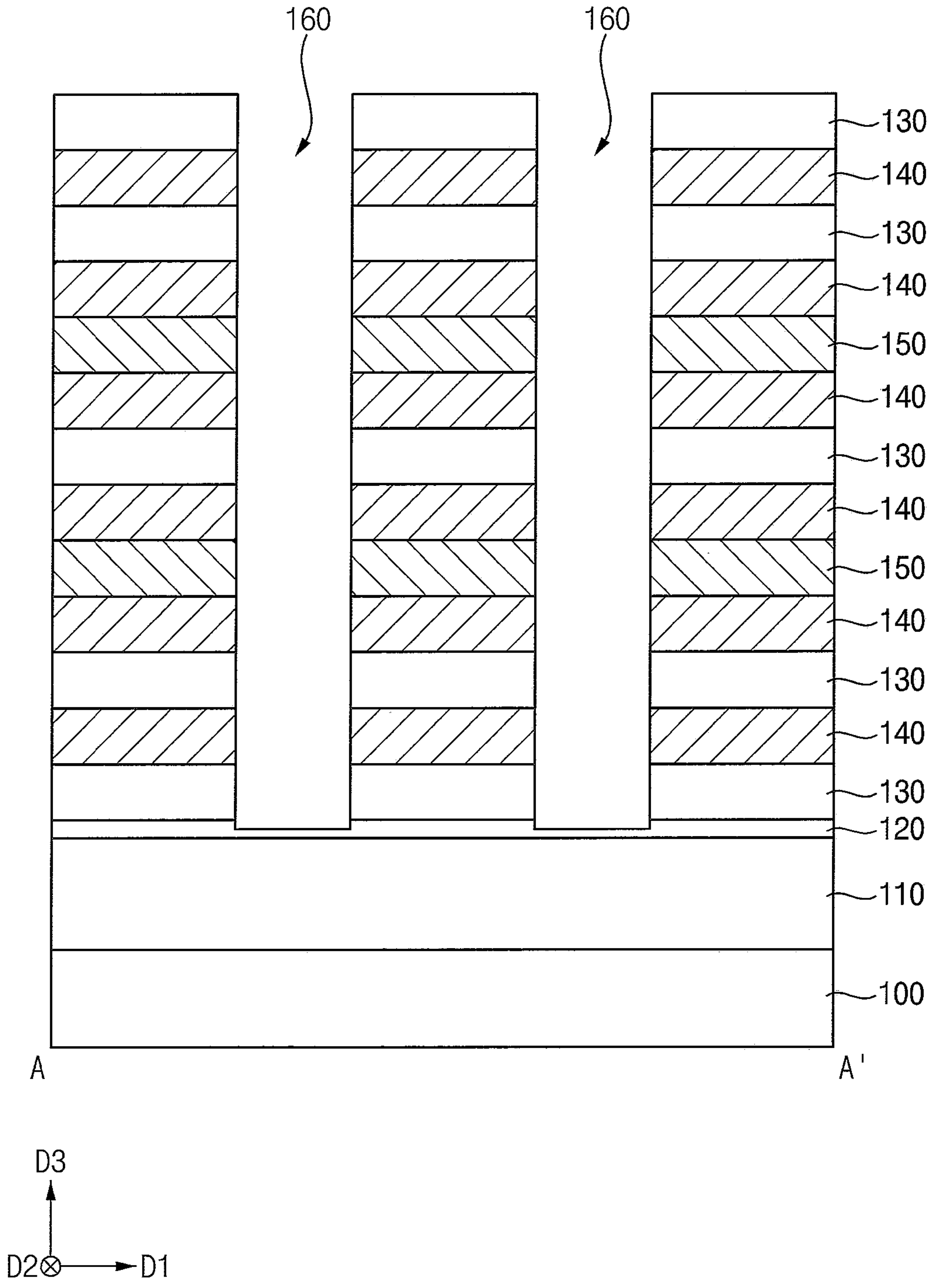

Referring to FIGS. 5 and 6, for example, a dry etching process may be performed to form a hole 160 through the first insulation layers 130, the multi-layers and the first sacrificial layers 150, which may expose an upper surface of the etch stop layer 120.

According to an example embodiment, a plurality of holes 160 may be formed to be spaced apart from each other in the first and second directions D1 and D2. For example, a plurality of holes 160 spaced apart from each other in the second direction D2 may form a hole column, and a plurality of hole columns may be spaced apart from each other in the first direction D1.

Figure 7:
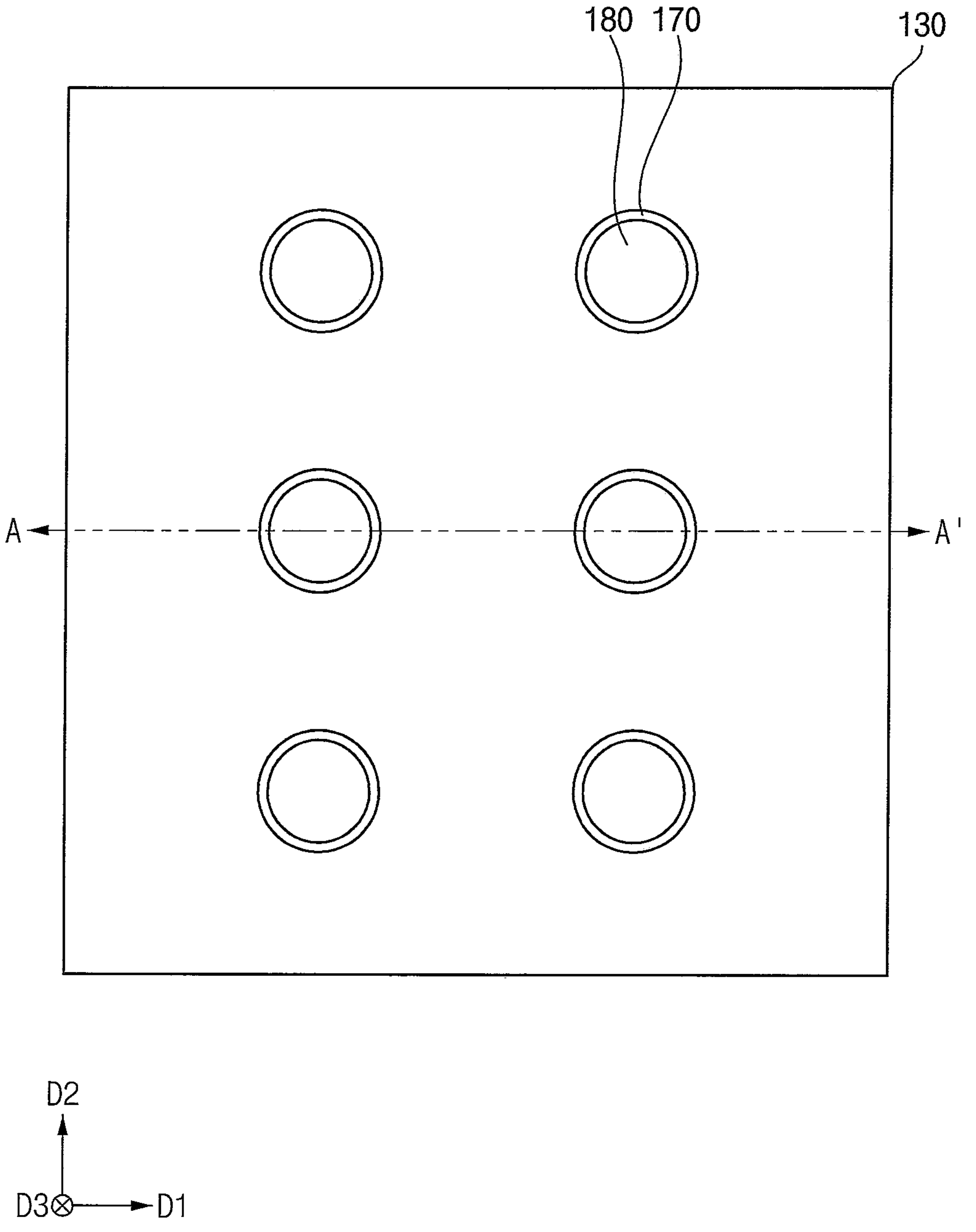
Figure 8:
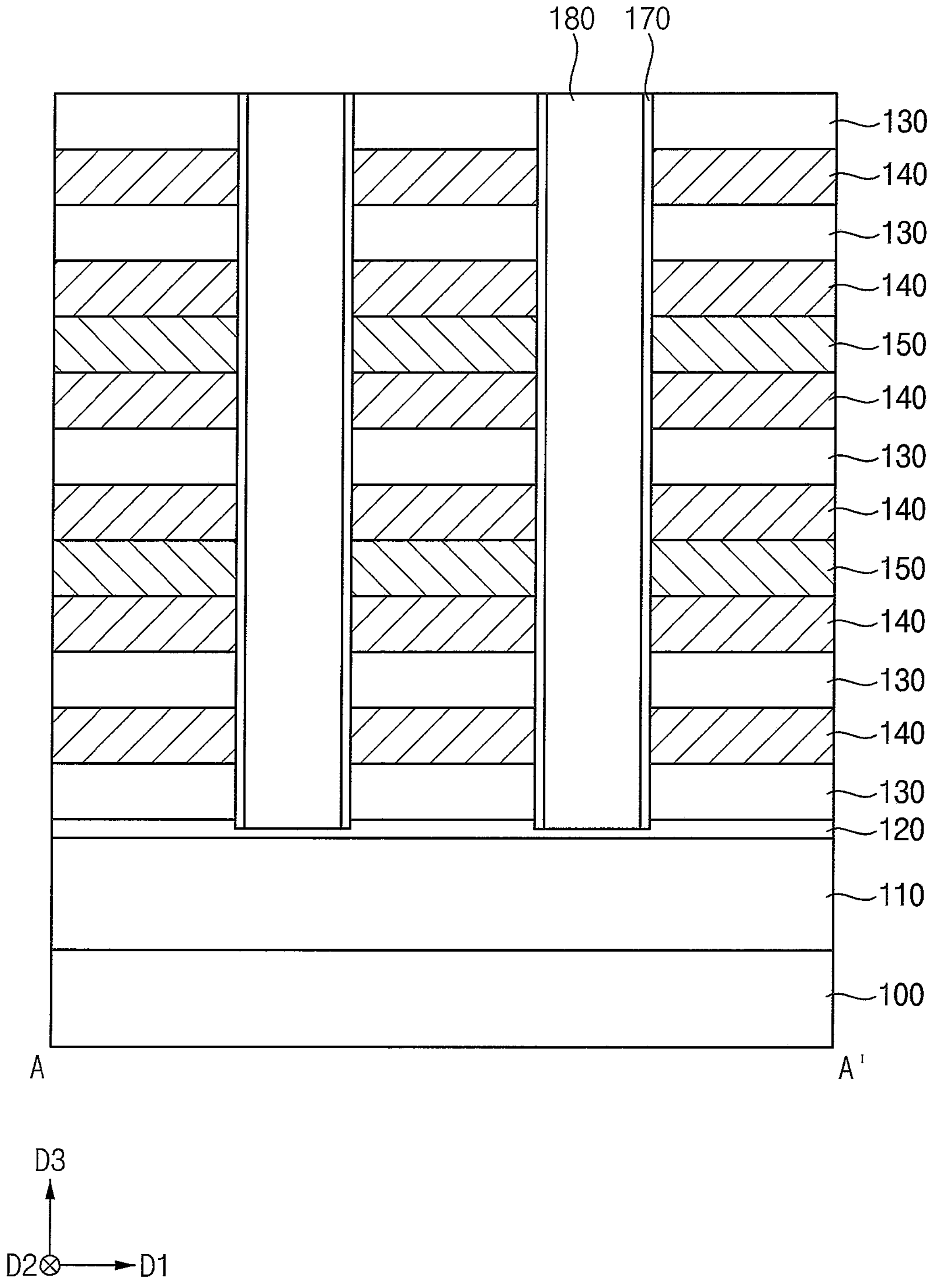

Referring to FIGS. 7 and 8, a channel layer 170 may be formed on a bottom and a sidewall of the hole 160 and an upper surface of an uppermost one of the first insulation layers 130, and an anisotropic etching process may be performed on the channel layer 170.

Thus, the channel layer 170 may be removed from the bottom of the hole 160 and the upper surface of the uppermost one of the first insulation layers 130 except on the sidewall of the hole 160. As the holes 160 arranged in the first and second directions D1 and D2 form the hole array, the channel layers 170 arranged in the first and second directions D1 and D2 may also form a channel layer array. The channel layer array may include a plurality of channel layer columns arranged in the first direction D1, and each of the plurality of channel layer columns may include a plurality of channel layers 170 arranged in the second direction D2.

A second sacrificial layer 180 may be formed to fill the hole 160 with the channel layer 150 on the sidewall thereof. The second sacrificial layer 180 may include an insulating nitride, e.g., silicon nitride.

Figure 9:
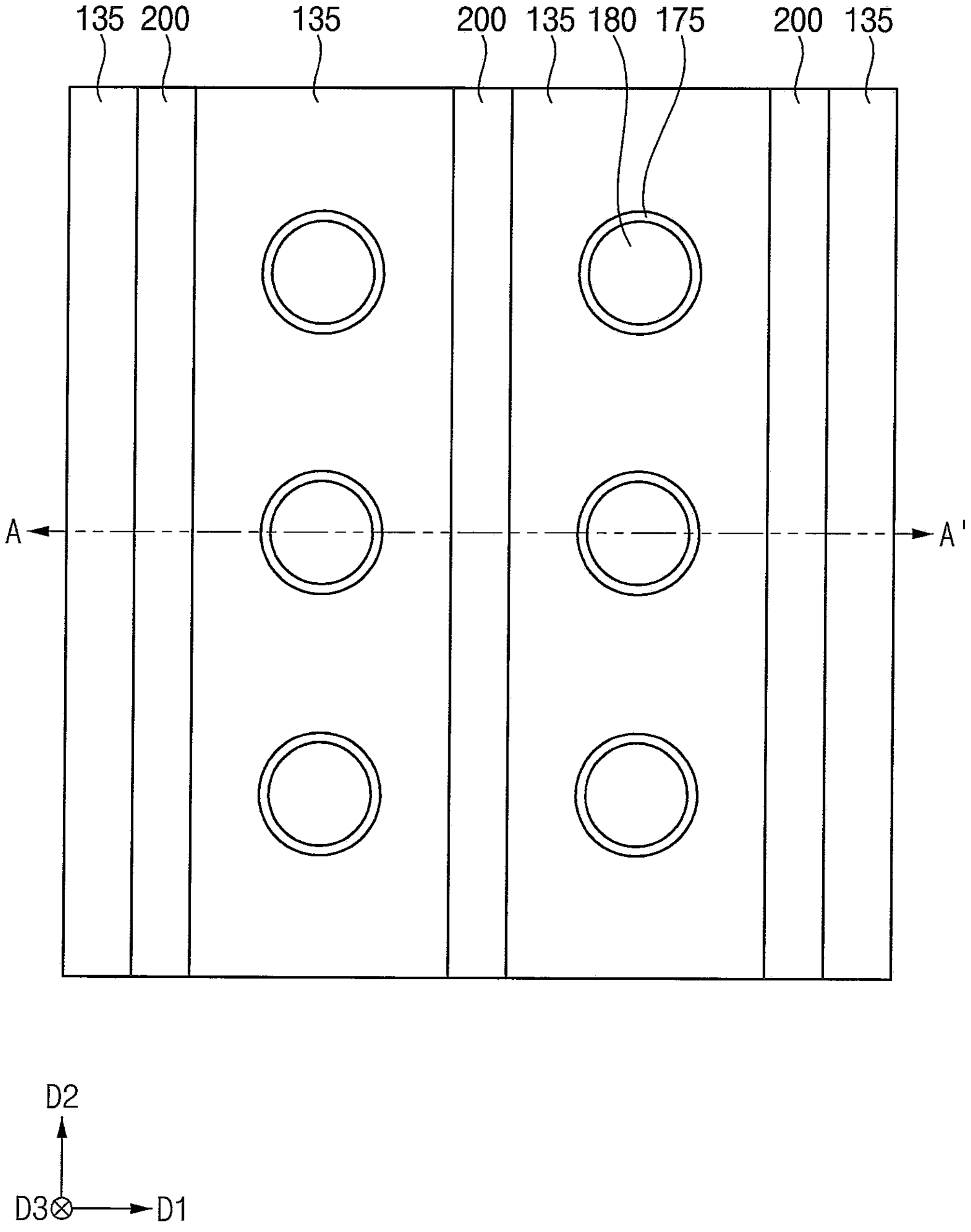
Figure 10:
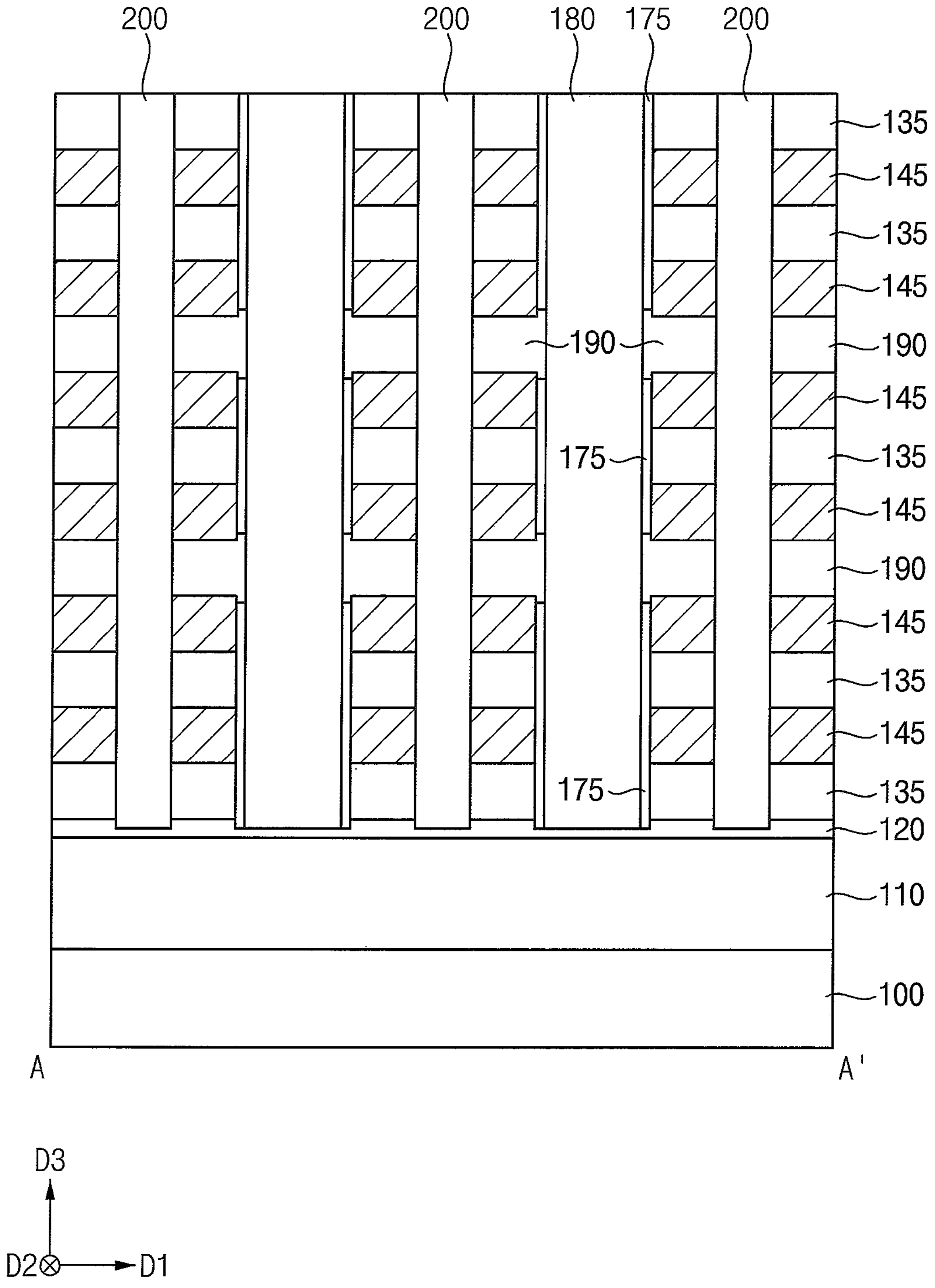

Referring to FIGS. 9 and 10, for example, a dry etching process may be performed to form a first opening through the first insulation layers 130, the multi-layers and the first sacrificial layers 150, which may expose the upper surface of the etch stop layer 120, and for example, a wet etching process may be performed to remove the first sacrificial layer 150 exposed by the first opening to form a first gap.

According to an example embodiment, the first opening may extend in the second direction D2, and a plurality of first openings may be spaced apart from each other in the first direction D1. Each of the first openings may be formed between the channel layer columns.

As the first opening is formed, the first insulation layer 130, the multi-layer and the first sacrificial layer 150 may be divided into first insulation patterns 135, preliminary multi-layered structures and first sacrificial patterns, respectively, each of which may extend in the second direction D2. Each of the preliminary multi-layered structures may include a first source/drain pattern 145, the first insulation pattern 135 and another first source/drain pattern 145.

As the first sacrificial layer 150 is removed by the wet etching process, the channel layer 170 may be partially exposed by the first gap, and a portion of the channel layer 170 exposed by the first gap may be removed. Thus, the first gap may be enlarged in the horizontal direction, and the portion of the channel layer 170, which may extend in the third direction D3, exposed by the first gap may be removed so that the channel layer 170 may be divided into a plurality of preliminary channels 175 spaced apart from each other in the third direction D3.

As the channel layers 170 arranged in the first and second directions D1 and D2 form the channel layer array, the preliminary channels 175 may be arranged in the first and second directions D1 and D2 at each level to form a preliminary channel array. The preliminary channel array may include a plurality of preliminary channel columns arranged in the first direction D1, and each of the plurality of preliminary channel columns may include a plurality of preliminary channels 175 spaced apart from each other in the second direction D2.

A second insulation layer 190 may be formed to fill the first gap, and a third sacrificial layer 200 may be formed to fill the first opening. The third sacrificial layer 200 may include an insulating nitride, e.g., silicon nitride.

Figure 11:
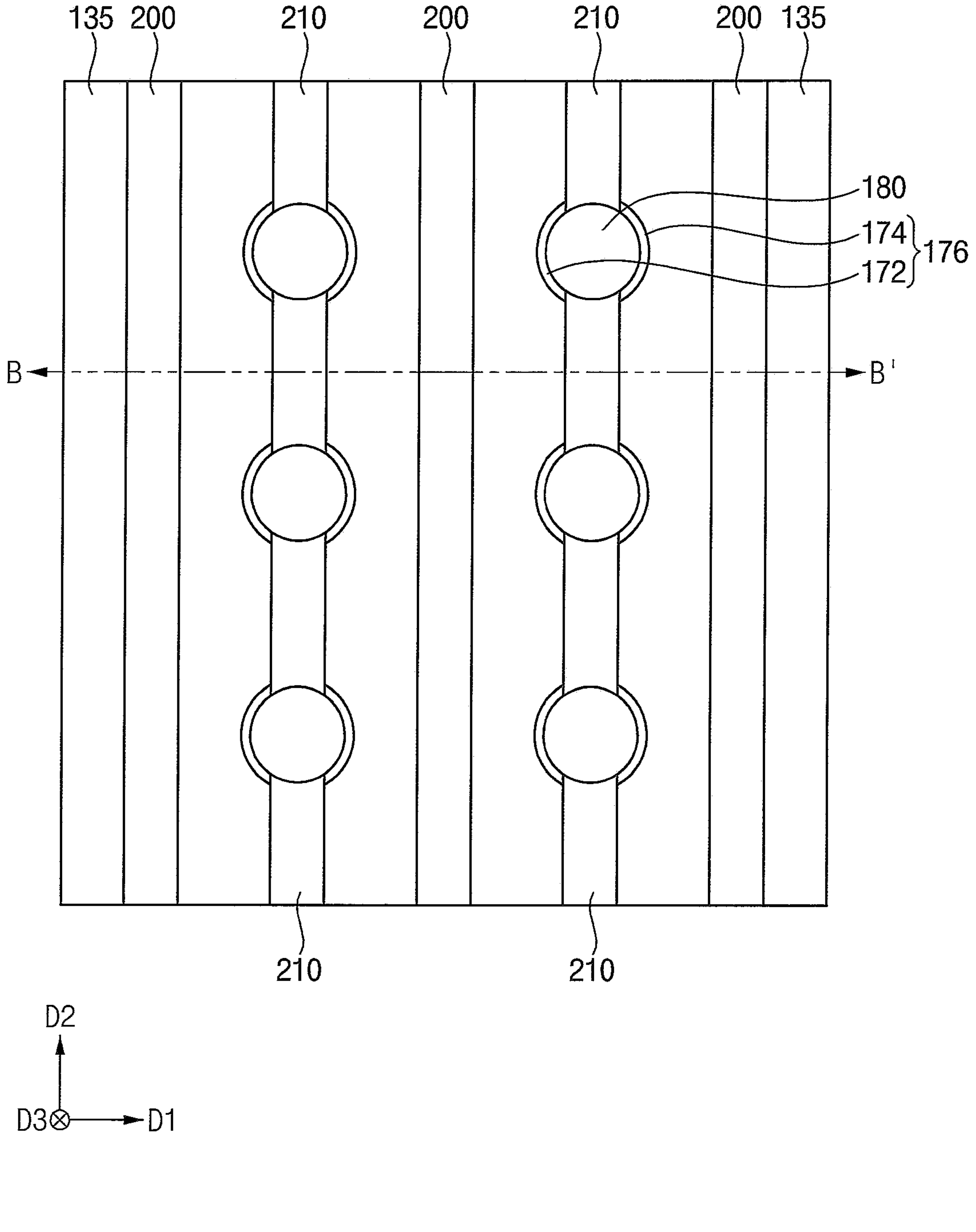
Figure 12:
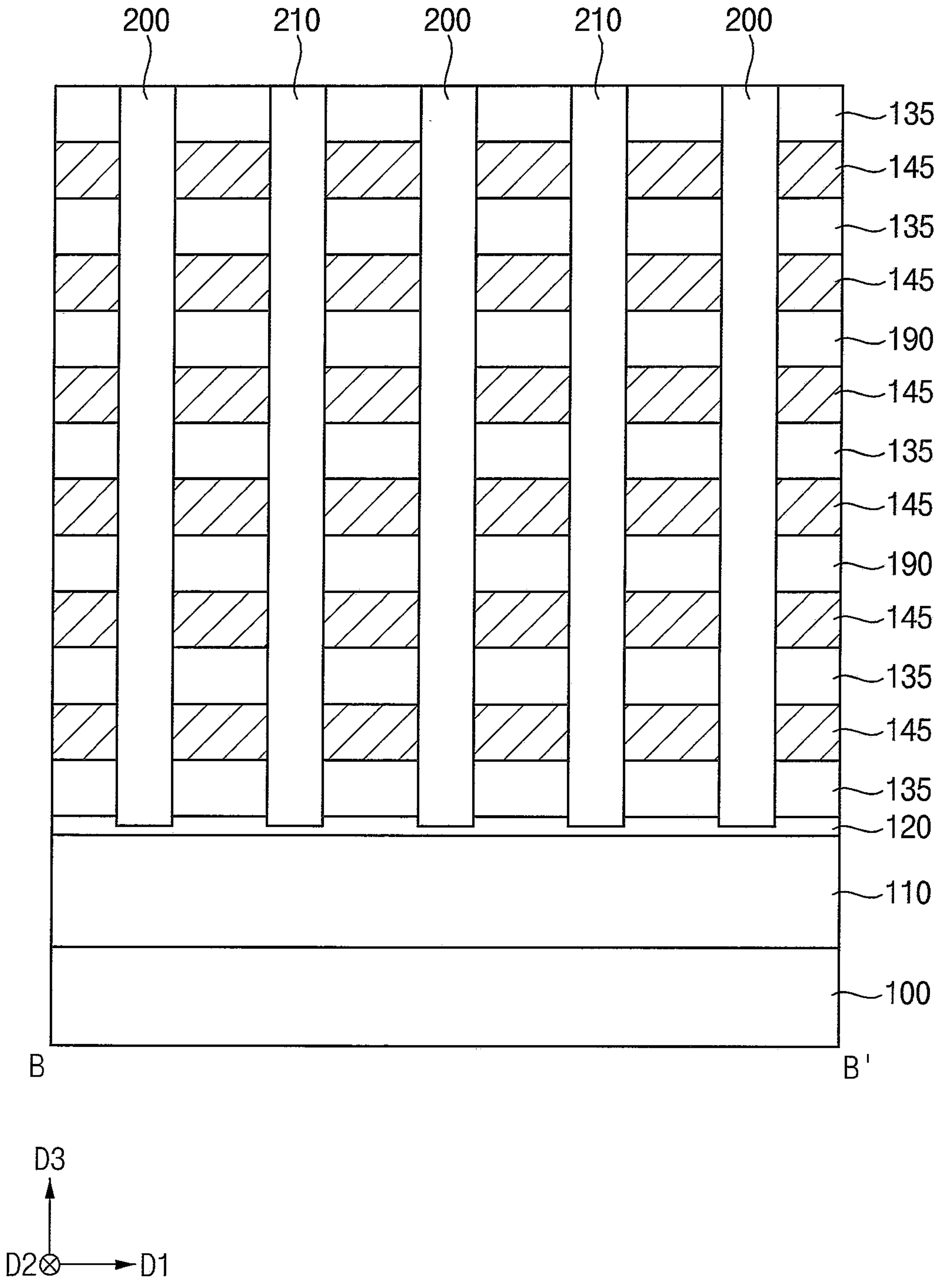

Referring to FIGS. 11 and 12, for example, a dry etching process may be performed to form a second opening through the first insulation patterns 135, the preliminary multi-layered structures, the first sacrificial patterns, the second insulation layer 190 and the preliminary channels 175, which may expose the upper surface of the etch stop layer 120, and a third insulation layer 210 may be formed in the second opening.

According to an example embodiment, the second opening may extend in the second direction D2 between ones of the preliminary channels 175 arranged in the second direction D2, which may be included in neighboring ones of the preliminary channel columns, respectively, and may extend through portions of the preliminary channels 175 facing each other in the second direction D2. Thus, each of the preliminary channels 175 may be divided into two parts in the first direction D1, and hereinafter, a pair of preliminary channels 175 spaced apart from each other by the second opening may be referred to as first and second channels 172 and 174, respectively.

Figure 13:
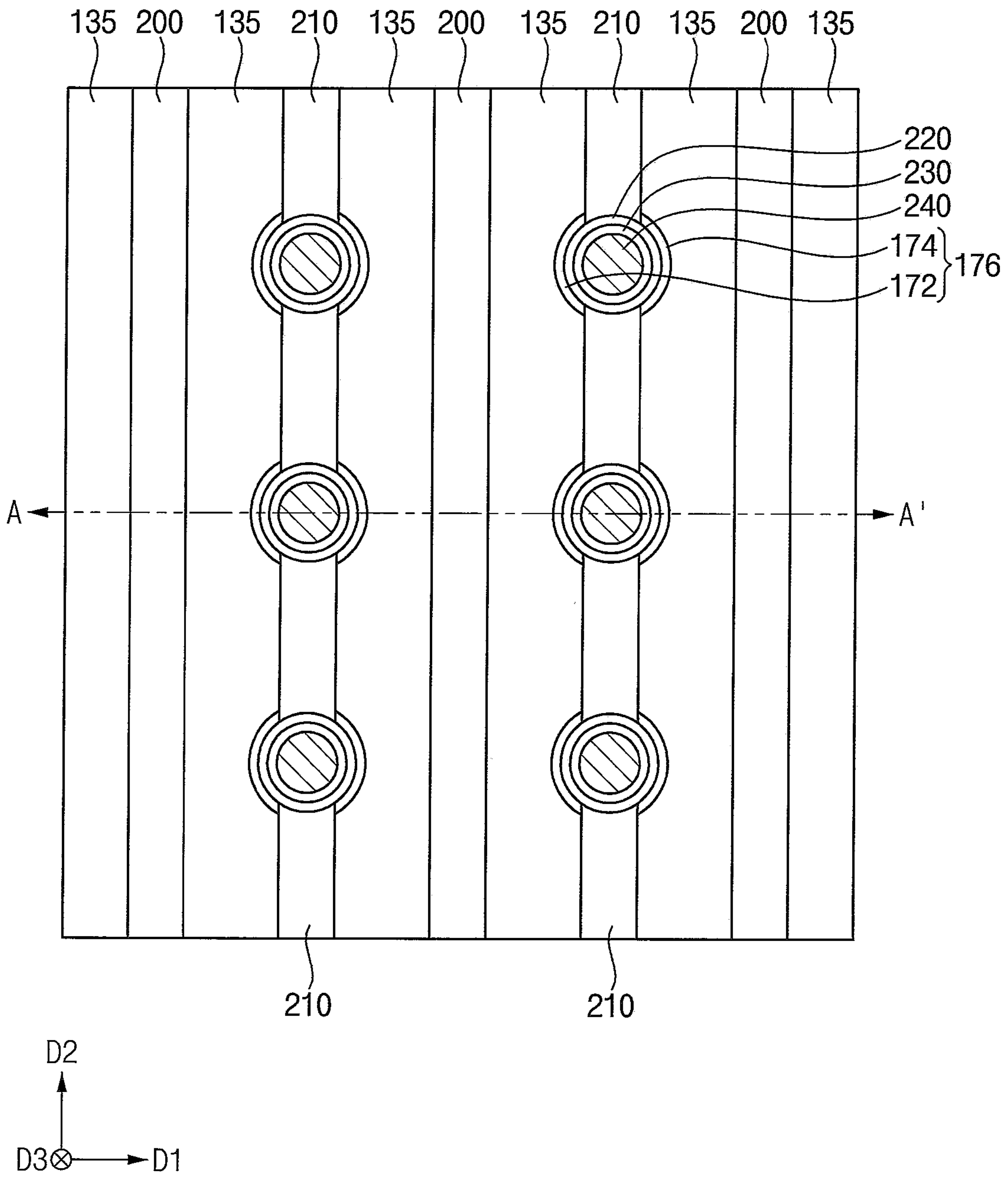
Figure 14:
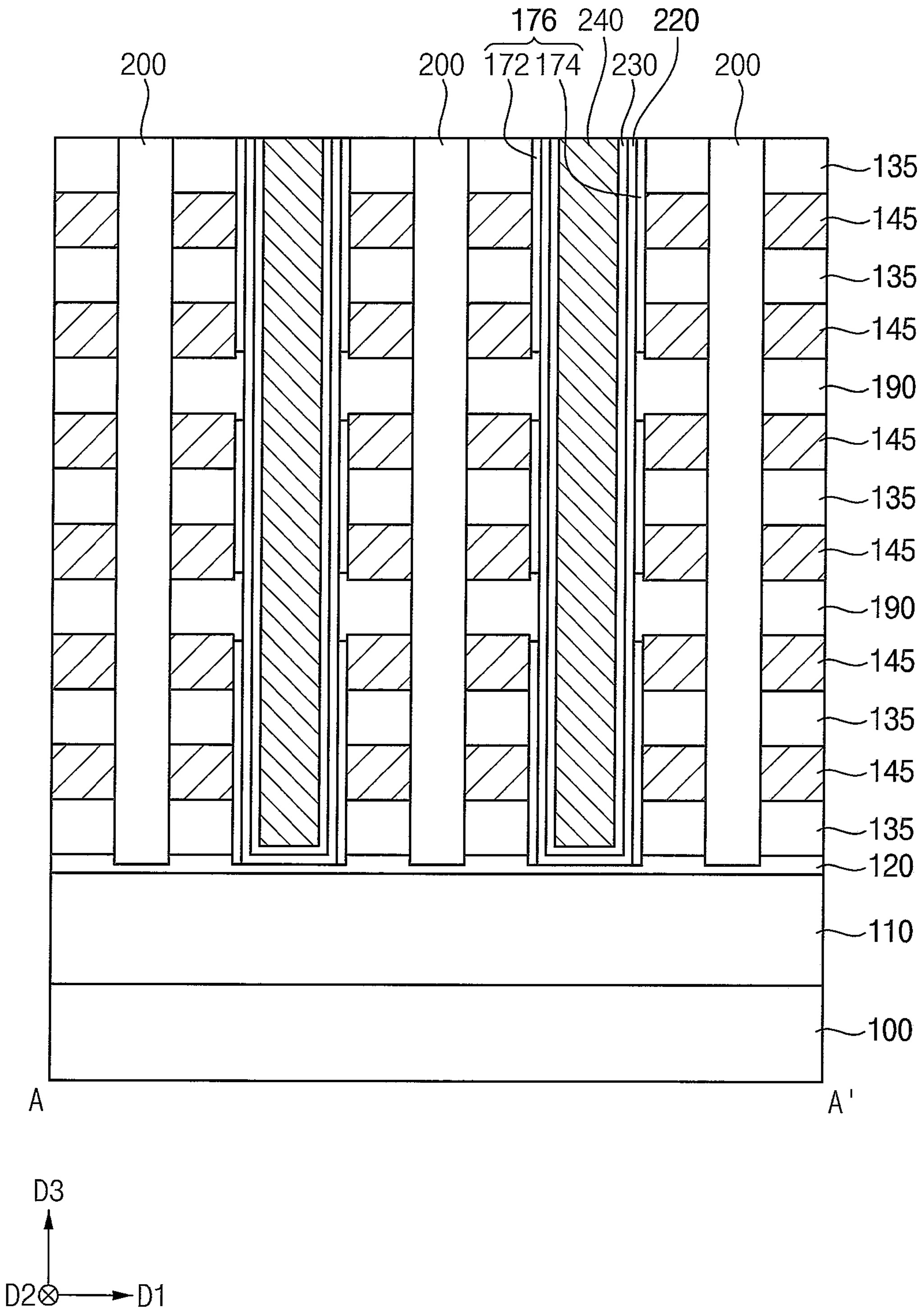

Referring to FIGS. 13 and 14, the second sacrificial layer 180 may be removed to expose inner sidewalls of the first and second channels 172 and 174, an inner sidewall of the second insulation layer 190 and the upper surface of the etch stop layer 120. In a space provided by the removal of the second sacrificial layer 180, a gate insulation layer, a ferroelectric layer and a first gate electrode layer may be sequentially stacked on the inner sidewalls of the first and second channels 172 and 174, the inner sidewall of the second insulation layer 190, the upper surface of the etch stop layer 120, and upper surfaces of the first and second channels 172 and 174, the uppermost one of the first insulation patterns 135, the third sacrificial layer 200 and the third insulation layer 210.

The first gate electrode layer, the ferroelectric layer and the gate insulation layer may be planarized until the upper surface of the uppermost one of the first insulation patterns 135 is exposed to form a first gate electrode 240, a ferroelectric pattern 230 and a first gate insulation pattern 220, respectively, in the hole 160.

According to an example embodiment, the first gate electrode 240 may have a pillar shape extending in the third direction D3, the ferroelectric pattern 230 may have a cup shape formed on a sidewall and a lower surface of the first gate electrode 240, and the first gate insulation pattern 220 may have a cup shape formed on an outer sidewall and a lower surface of the ferroelectric pattern 230.

On an outer sidewall of the first gate insulation pattern 220, the inner sidewalls of the first and second channels 172 and 174, the inner sidewall of the second insulation layer 190 and a sidewall of the third insulation layer 210 may be formed.

Figure 15:
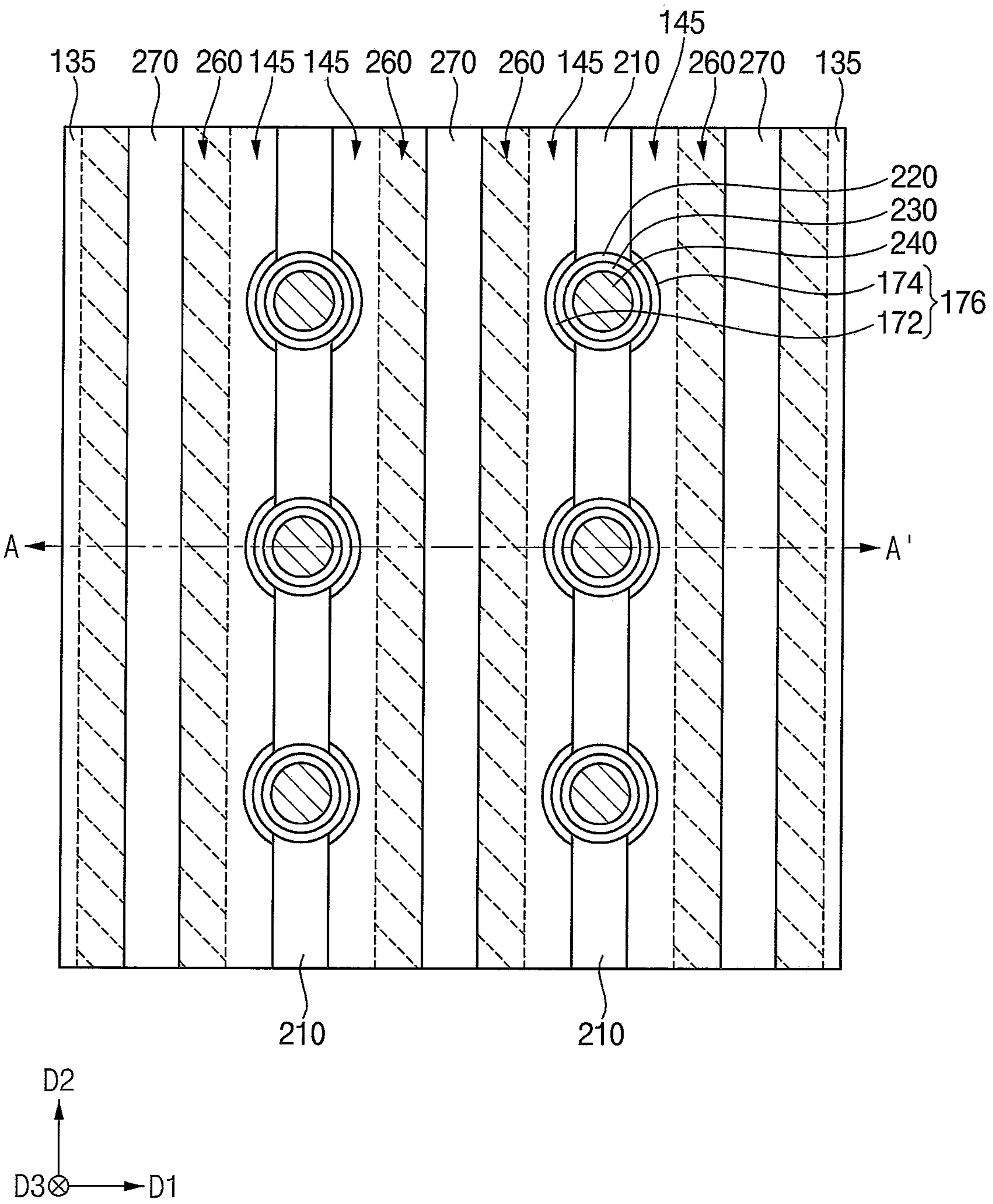
Figure 16:
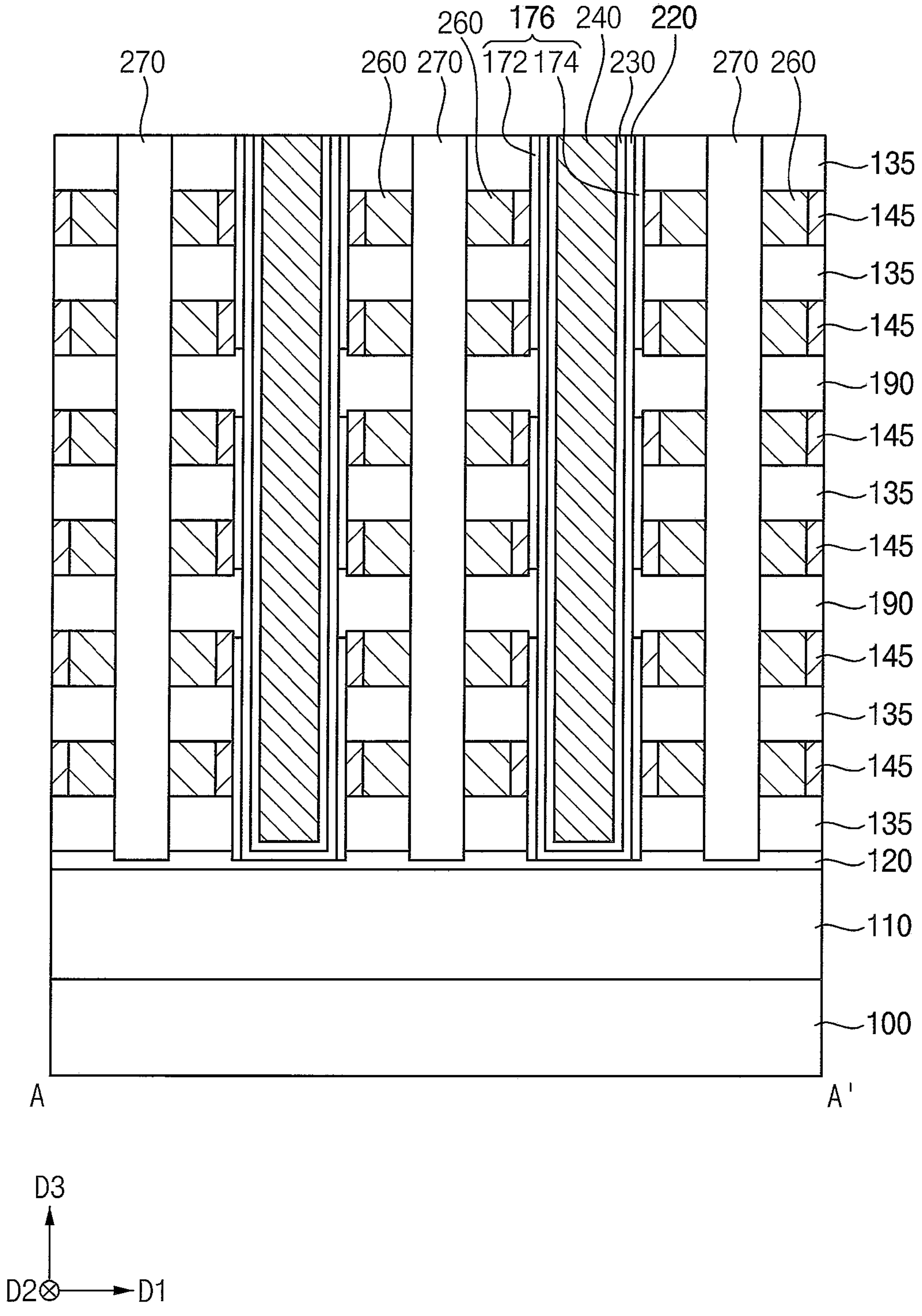

Referring to FIGS. 15 and 16, the third sacrificial layer 200 may be removed to form the first opening again, the first source/drain pattern 145 exposed by the first opening may be partially removed to form a recess, and a second source/drain pattern 260 may be formed in the recess.

According to an example embodiment, the recess may be formed by a wet etching process, and in some embodiments, the first and second source/drain pattern 145 may be entirely removed. The second source/drain pattern 260 may extend in the second direction D2, and may contact the first source/drain pattern 145.

The first and second source/drain patterns 145 and 260 contacting each other may form a source/drain pattern structure. A source/drain pattern structure, the first insulation pattern 135 and another source/drain pattern structure sequentially stacked in the third direction D3 may form a multi-layered structure.

A fourth insulation layer 270 may be formed to fill the first opening.

Referring to FIGS. 1 and 2 again, a second insulating interlayer 280 may be formed on the above-described structures, and a first contact plug 290 may be formed through the second insulating interlayer 280 to contact an upper surface of the first gate electrode 240.

A third insulating interlayer 300 may be formed on the second insulating interlayer 280 and the first contact plug 290, and a first wiring 310 may be formed through the third insulating interlayer 300 to contact an upper surface of the first contact plug 290.

According to an example embodiment, the first wiring 310 may extend in the first direction D1, and may commonly contact upper surfaces of the first contact plugs 290.

By the above processes, the 3D FeRAM device may be manufactured.

Figure 17:
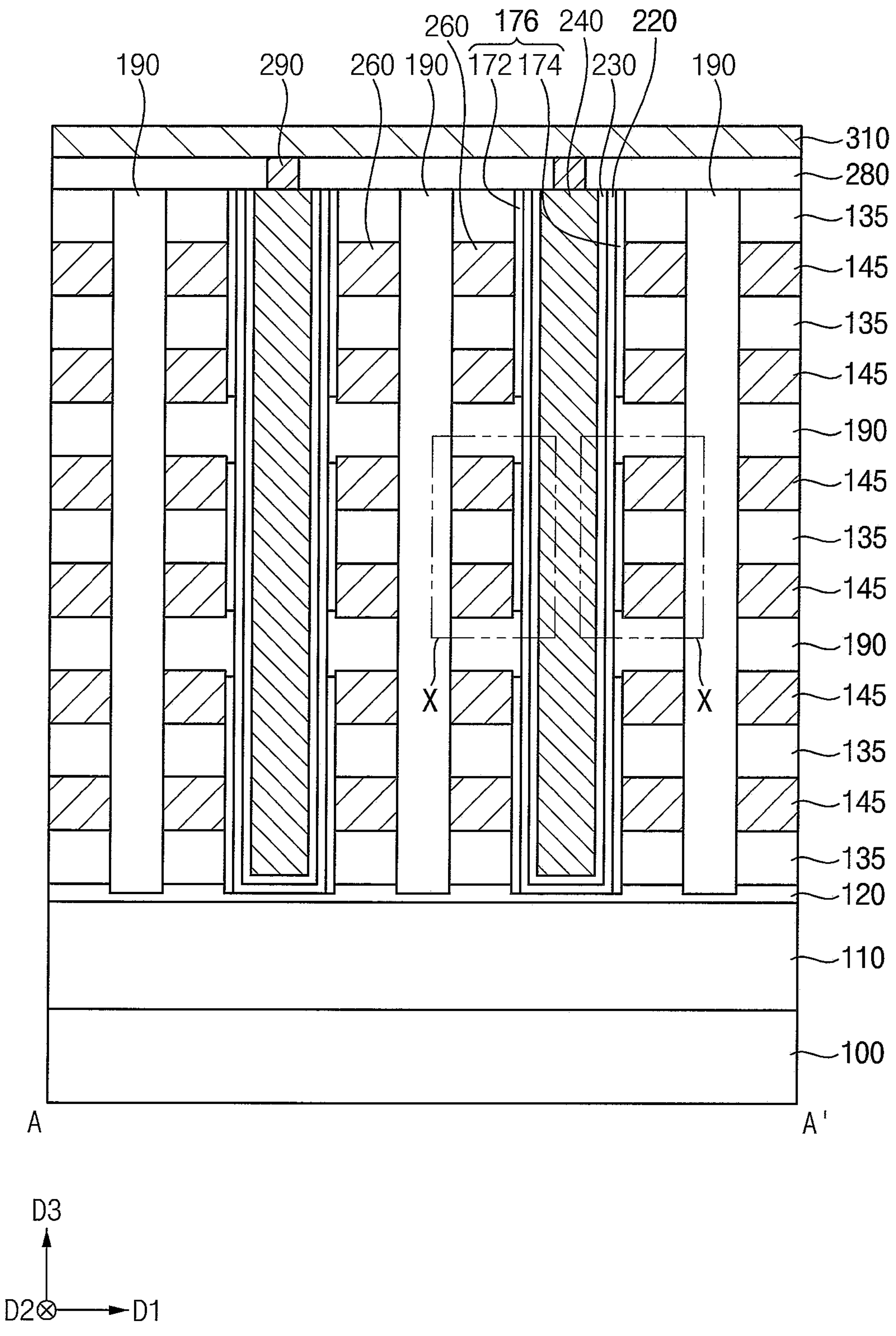
FIG. 17 is a cross-sectional view illustrating a 3D FeRAM device, in accordance with example embodiments.

FIG. 17 is a cross-sectional view illustrating a 3D FeRAM device in accordance with an example embodiment, which may correspond to FIG. 2.

This 3D FeRAM device may be substantially the same as or similar to that of FIGS. 1 and 2, except for not including the second source/drain pattern 260.

This 3D FeRAM device may be manufactured by not performing the processes substantially the same as or similar to those illustrated with reference to FIGS. 15 and 16, for example, the processes for partially removing the first source/drain pattern 145 to form the recess and forming the second source/drain pattern 260 in the recess.

Thus, when the processes substantially the same as or similar to those illustrated with reference to FIGS. 9 and 10 are performed, the second insulation layer 190 may be formed not only in the first gap but also in the first opening, and may not be removed.

Figure 18:
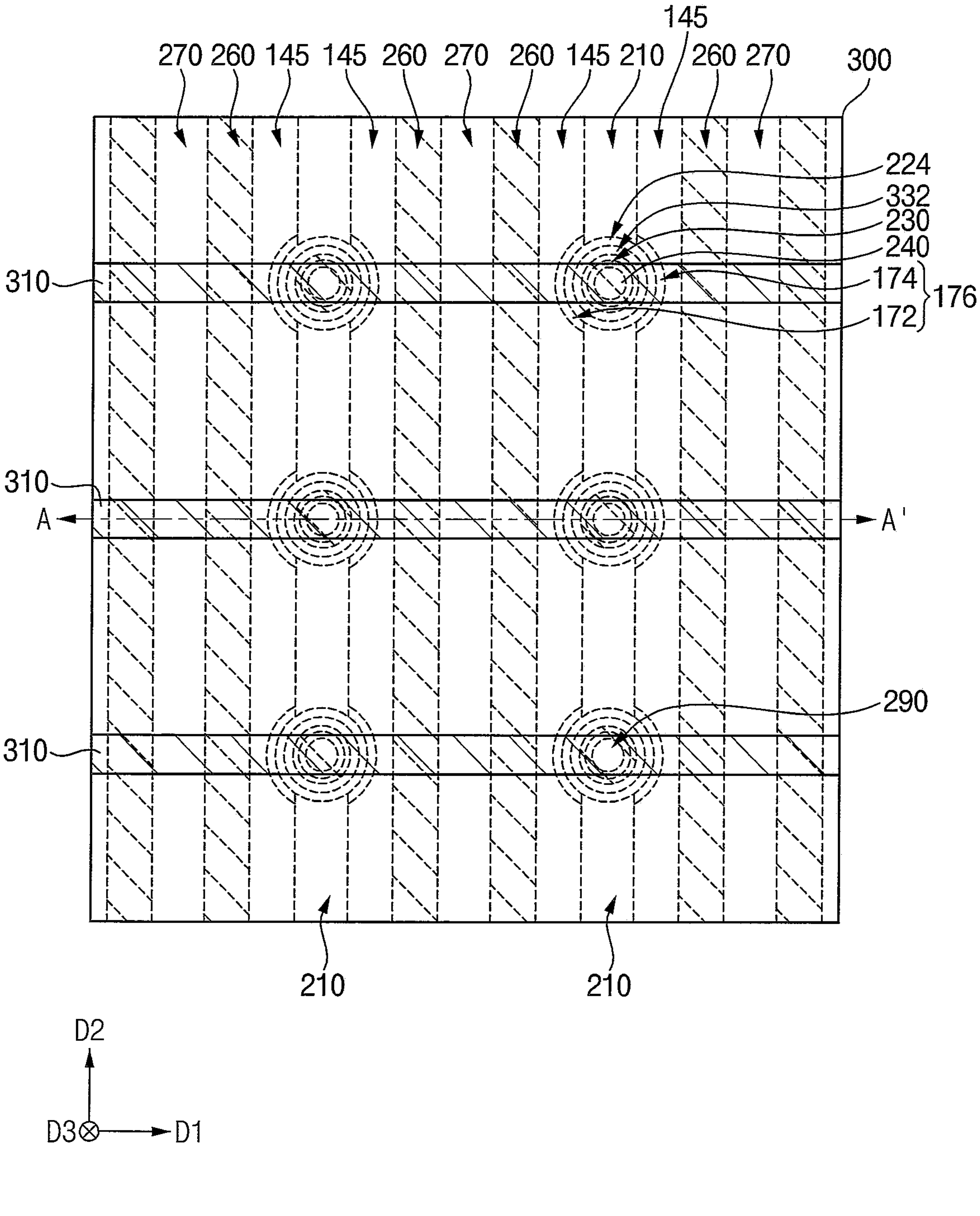
FIGS. 18 and 19 are a plan view and a cross-sectional view, respectively, illustrating a 3D FeRAM device, in accordance with example embodiments.
Figure 19:
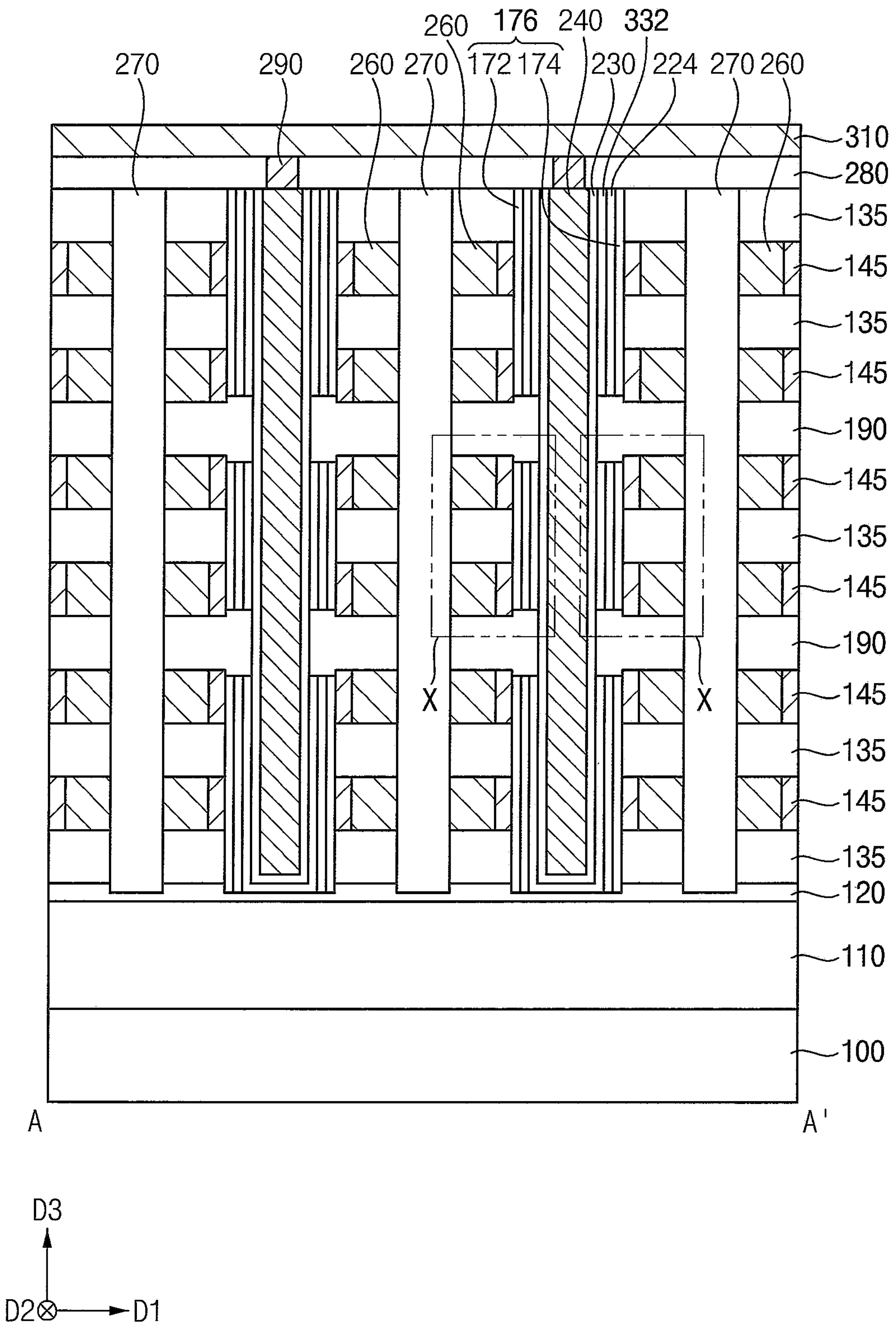

FIGS. 18 and 19 are a plan view and a cross-sectional view, respectively, illustrating a 3D FeRAM device in accordance with an example embodiment, which may correspond to FIGS. 1 and 2, respectively.

This 3D FeRAM device may be substantially the same as or similar to that of FIGS. 1 and 2, except for further including a second gate electrode 332 between the ferroelectric pattern 230 and a third gate insulation pattern 224.

The second gate electrode 332 may include a metal, e.g., tungsten. Thus, the ferroelectric pattern 230 may be formed between the first and second gate electrodes 240 and 332 including a metal, and thus, electric characteristics of the ferroelectric pattern 230 may be enhanced.

According to an example embodiment, the second gate electrode 332 may be formed on an outer sidewall of the ferroelectric pattern 230, and a plurality of second gate electrodes 332 may be spaced apart from each other in the third direction D3.

Unlike the first gate insulation pattern 220 illustrated with reference to FIGS. 1 and 2, a plurality of third gate insulation patterns 224, which may be formed between the second gate electrode 332 and each of the first and second channels 172 and 174, may be formed to be spaced apart from each other in the third direction D3, That is, the second gate electrode 332, the third gate insulation pattern 224 and the first channel 172 sequentially stacked in the horizontal direction may be formed on the outer sidewall of the ferroelectric pattern 230, or the second gate electrode 332, the third gate insulation pattern 224 and the second channel 174 sequentially stacked in the horizontal direction may be formed on the outer sidewall of the ferroelectric pattern 230.

Figure 20:
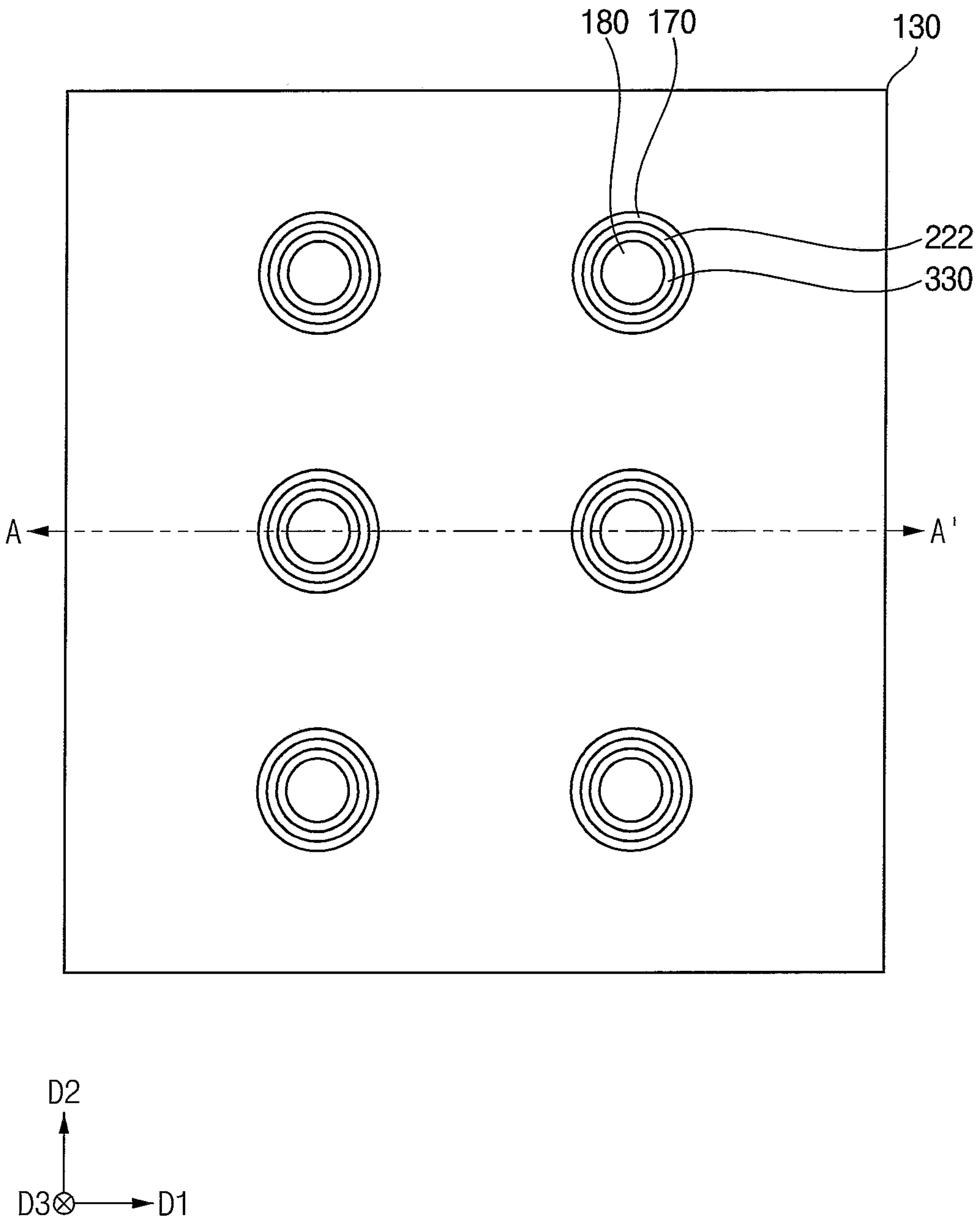
FIGS. 20 to 24 are plan views and cross-sectional views illustrating a method of manufacturing a 3D FeRAM device, in accordance with example embodiments.
Figure 21:
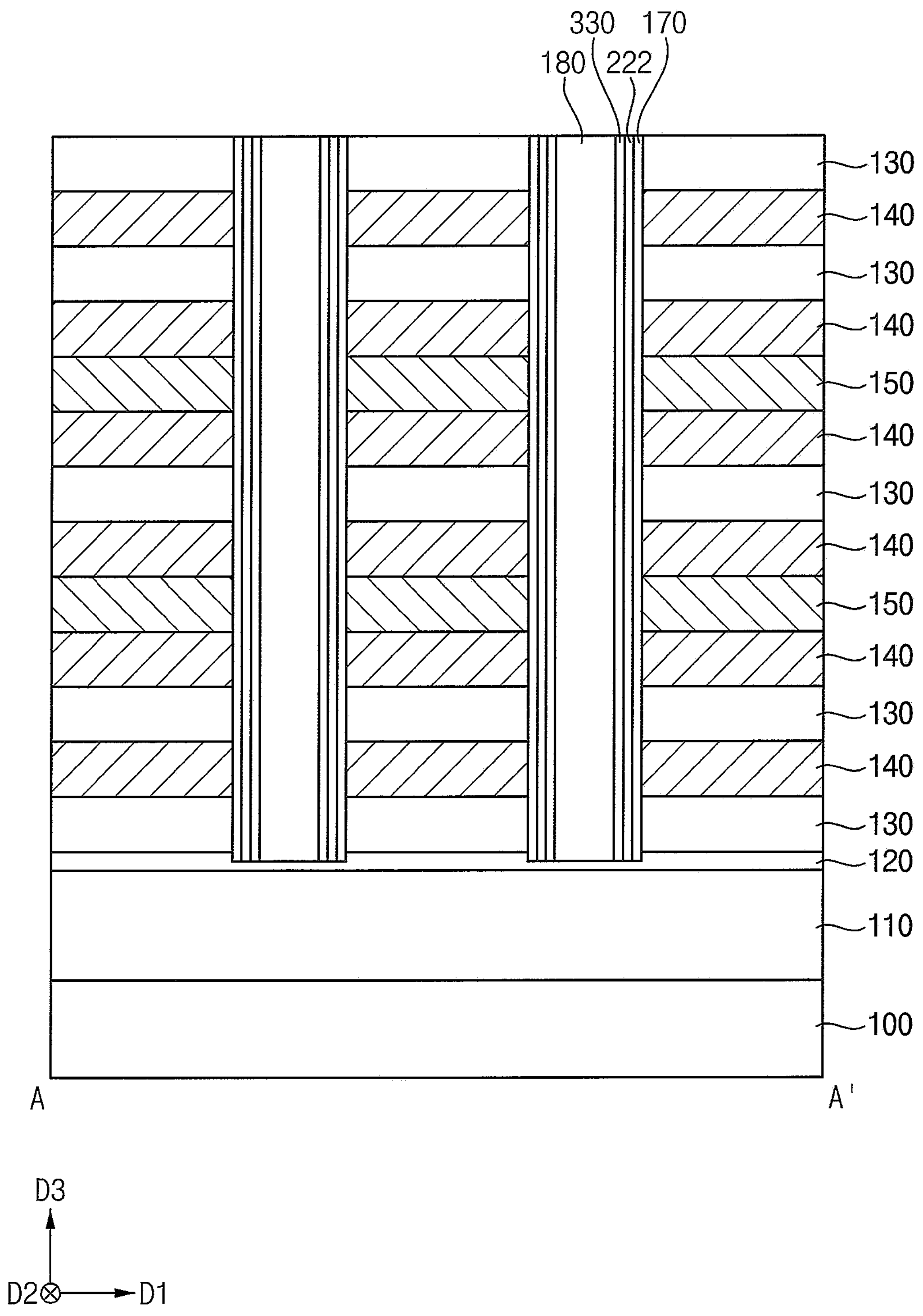
Figure 22:
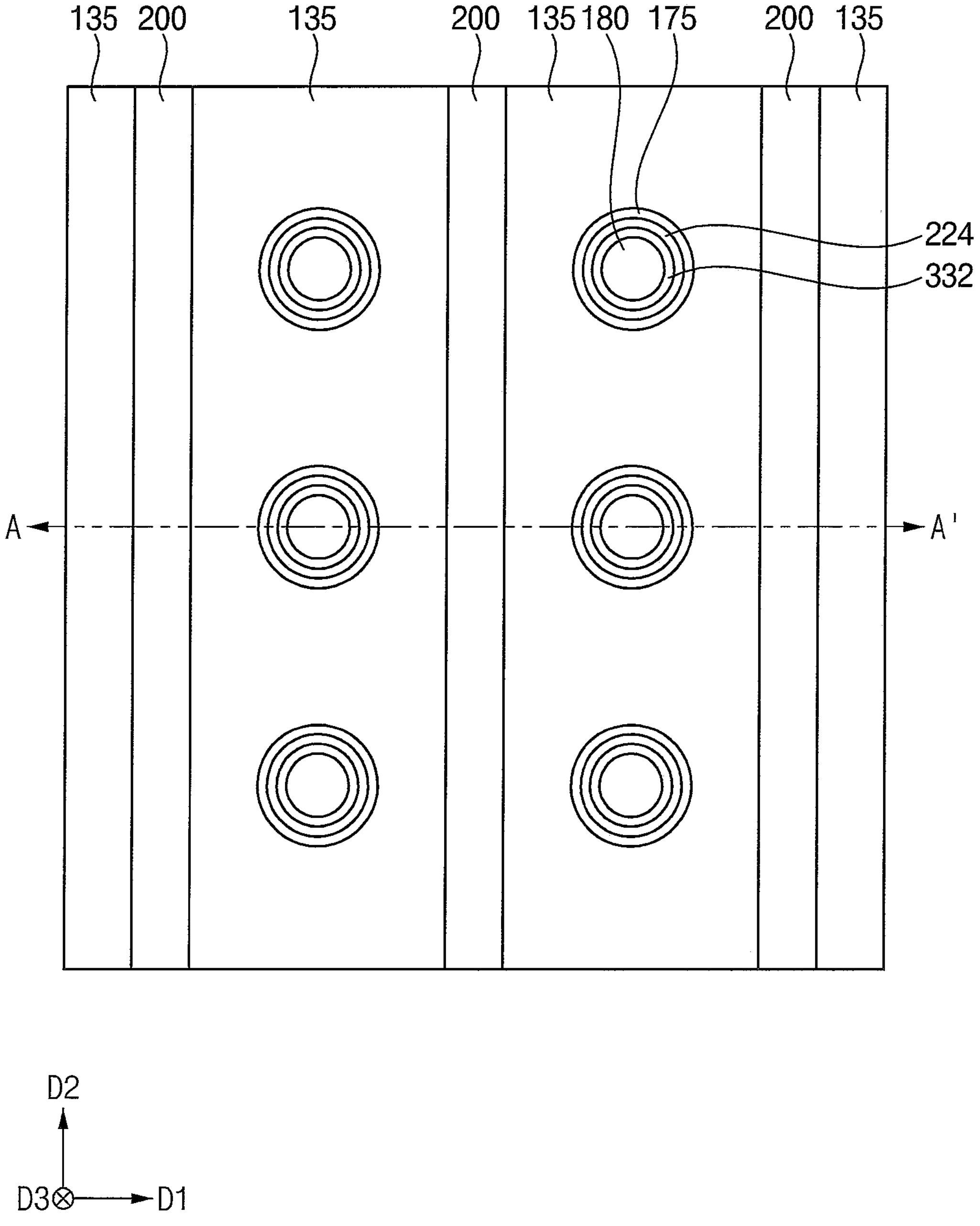
Figure 23:
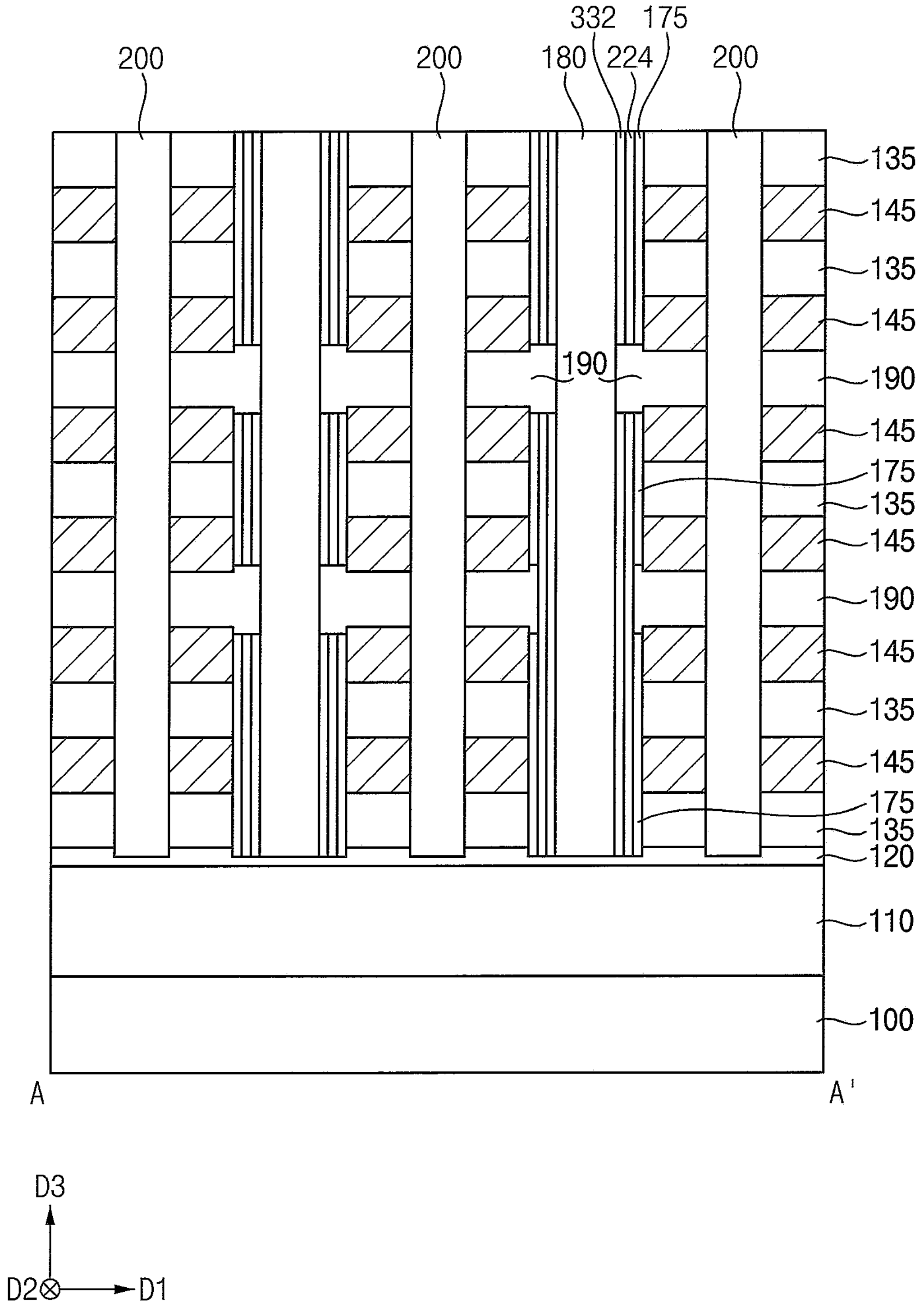
Figure 24:
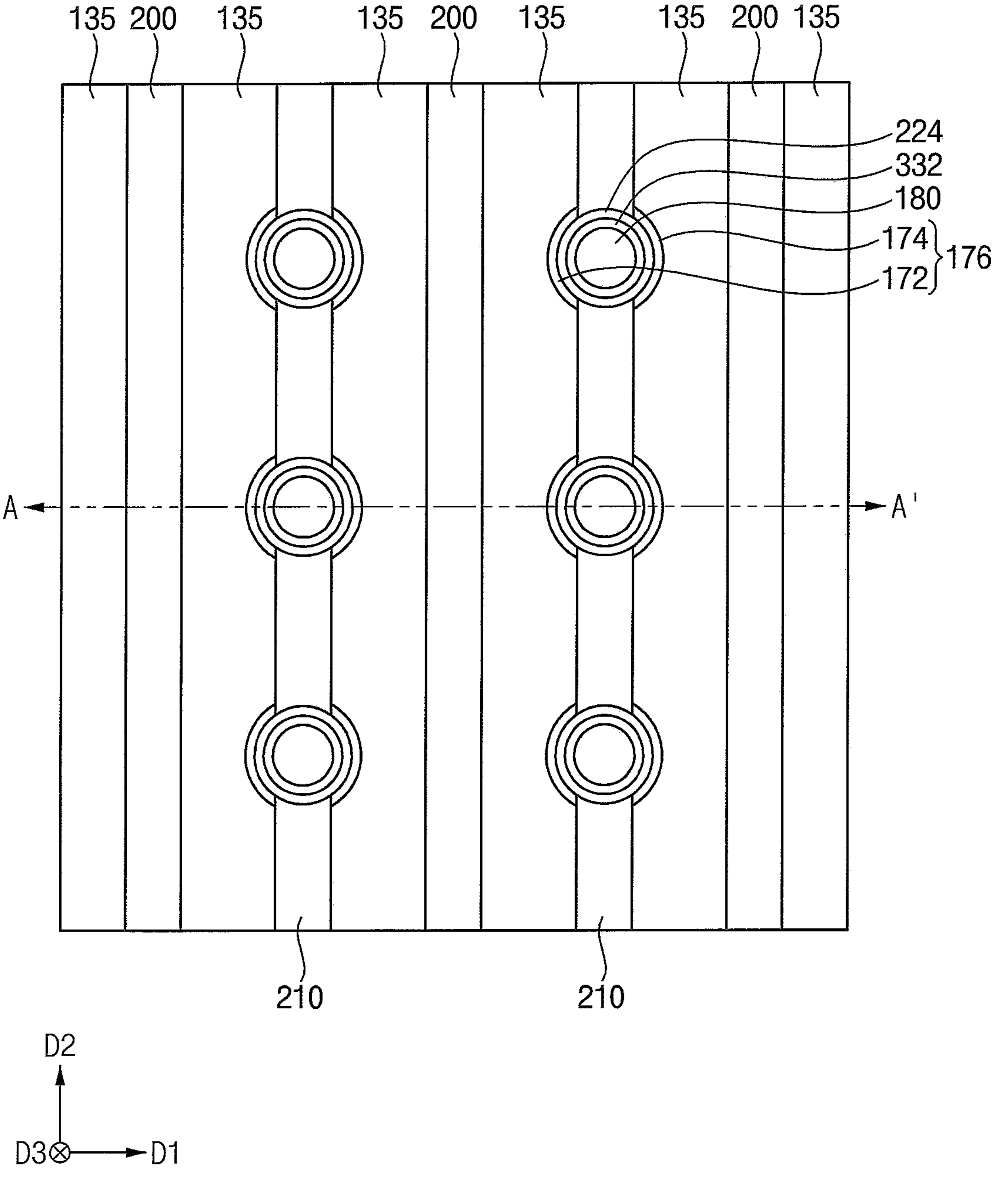

FIGS. 20 to 24 are plan views and cross-sectional views illustrating a method of manufacturing a 3D FeRAM device, in accordance with example embodiments. FIGS. 20, 22 and 24 are plan views, and FIGS. 21 and 23 are cross-sectional views taken along lines A-A' of corresponding plan views, respectively.

This method of manufacturing the 3D FeRAM device may include processes substantially the same as or similar to those illustrated with reference to FIGS. 1 to 16, and thus repeated explanations thereof are omitted herein.

Referring to FIGS. 20 and 21, processes similar to those illustrated with reference to FIGS. 3 to 8 may be performed.

However, not only the channel layer 170 but also a gate insulation layer and a second gate electrode layer 330 may be sequentially stacked on the bottom and the sidewall of the hole 160 and the upper surface of the uppermost one of the first insulation layers 130, and an anisotropic etching process may be performed on the second gate electrode layer 330, the gate insulation layer and the channel layer 170.

Thus, the channel layer 170, a second gate insulation pattern 222 and the second gate electrode layer 330 sequentially stacked in the horizontal direction may be formed on the sidewall of the hole 160.

The second sacrificial layer 180 may be formed to fill a remaining portion of the hole 160.

Referring to FIGS. 22 and 23, processes substantially the same as or similar to those illustrated with reference to FIGS. 9 and 10 may be performed.

However, as the first sacrificial layer 150 is removed by a wet etching process, the channel layer 170 may be partially removed by the first gap, and not only the exposed portion of the channel layer 170 but also portions of the second gate insulation pattern 222 and the second gate electrode layer 330 adjacent thereto may be removed.

Accordingly, the channel layer 170 extending in the third direction D3 may be divided into a plurality of preliminary channels 175 spaced apart from each other in the third direction D3, and the second gate insulation pattern 222 and the second gate electrode layer 330 each of which may extend in the third direction D3 may be divided into the third gate insulation patterns 224 and the second gate electrodes 332, respectively.

Referring to FIG. 24, processes substantially the same as or similar to those illustrated with reference to FIGS. 11 to 12 may be performed.

Thus, the second opening may be formed through the first insulation patterns 135, the preliminary multi-layered structures, the first sacrificial patterns, the second insulation layer 190 and the preliminary channels 175 by a dry etching process, and the third insulation layer 210 may be formed in the second opening.

Referring to FIGS. 18 and 19 again, processes substantially the same as or similar to those illustrated with reference to FIGS. 13 to 16 and FIGS. 1 and 2 may be performed to complete the fabrication of the 3D FeRAM device.

The second gate electrode 332 may be formed on the outer sidewall of the ferroelectric pattern 230, the third gate insulation pattern 224 may be formed on the outer sidewall of the second gate electrode 332, and each of the first and second channels 172 and 174 may be formed on the outer sidewall of the third gate insulation pattern 224.

FIGS. 25 to 28 are cross-sectional views illustrating 3D FeRAM devices, respectively, in accordance with example embodiments, which may correspond to FIG. 2.

These 3D FeRAM devices may be substantially the same as or similar to that of FIGS. 1 and 2, except for some elements, and thus, repeated explanations thereof are omitted herein.

Figure 25:
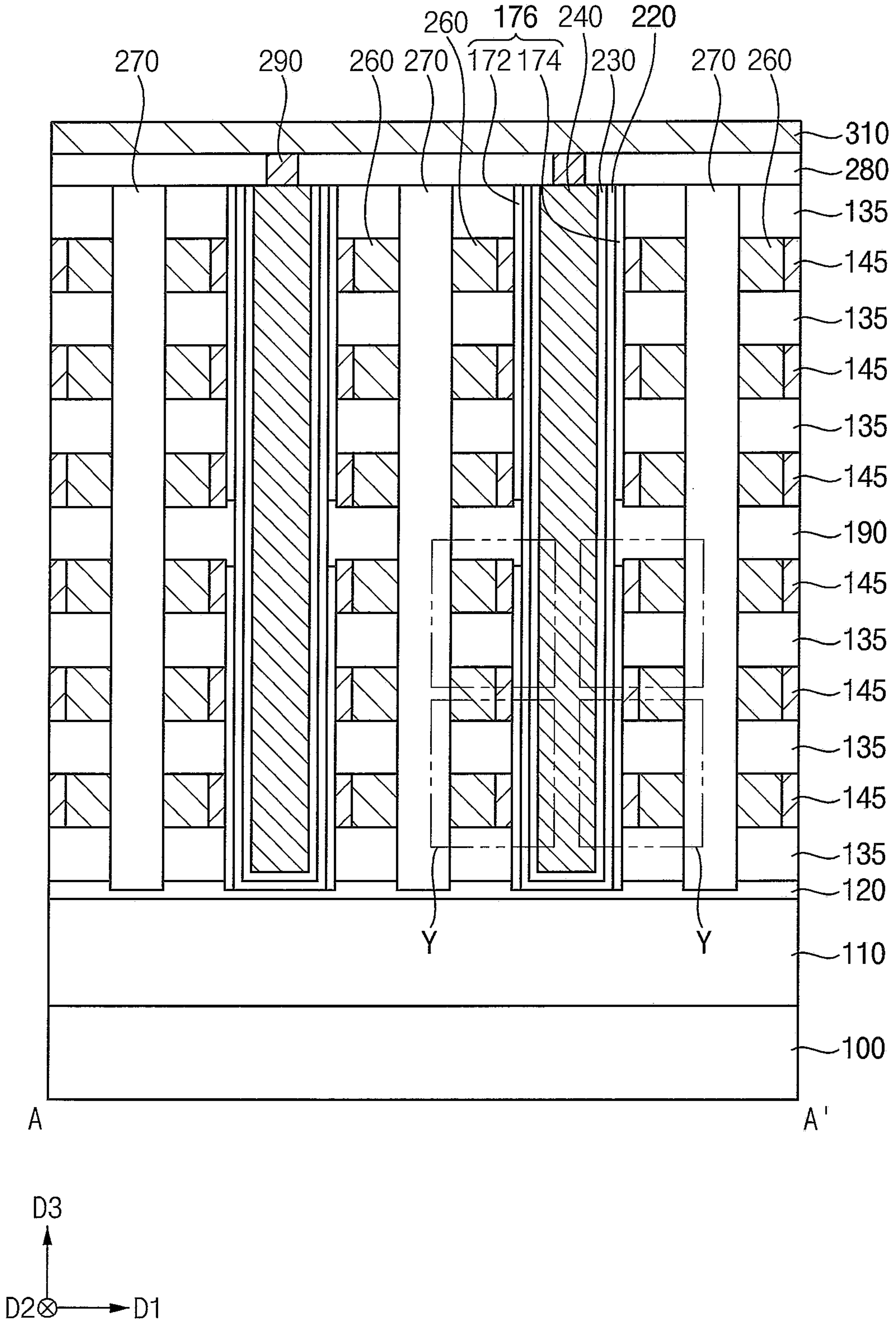
FIGS. 25 to 28 are cross-sectional views illustrating 3D FeRAM devices, respectively, in accordance with example embodiments.

Referring to FIG. 25, a unit cell of the 3D FeRAM device may be formed in a region Y.

According to an embodiment, three source/drain pattern structures spaced apart from each other may be formed in each of the multi-layered structures, which may be spaced apart from each other in the third direction D3 by the second insulation layer 190. For example, the third source/drain pattern structures may serve as a source, a drain and a source, respectively.

According to an embodiment, a middle one of the three source/drain pattern structures arranged in the third direction D3 may serve as a common drain of unit cells at upper and lower portions, respectively, of each of the multi-layered structures.

Figure 26:
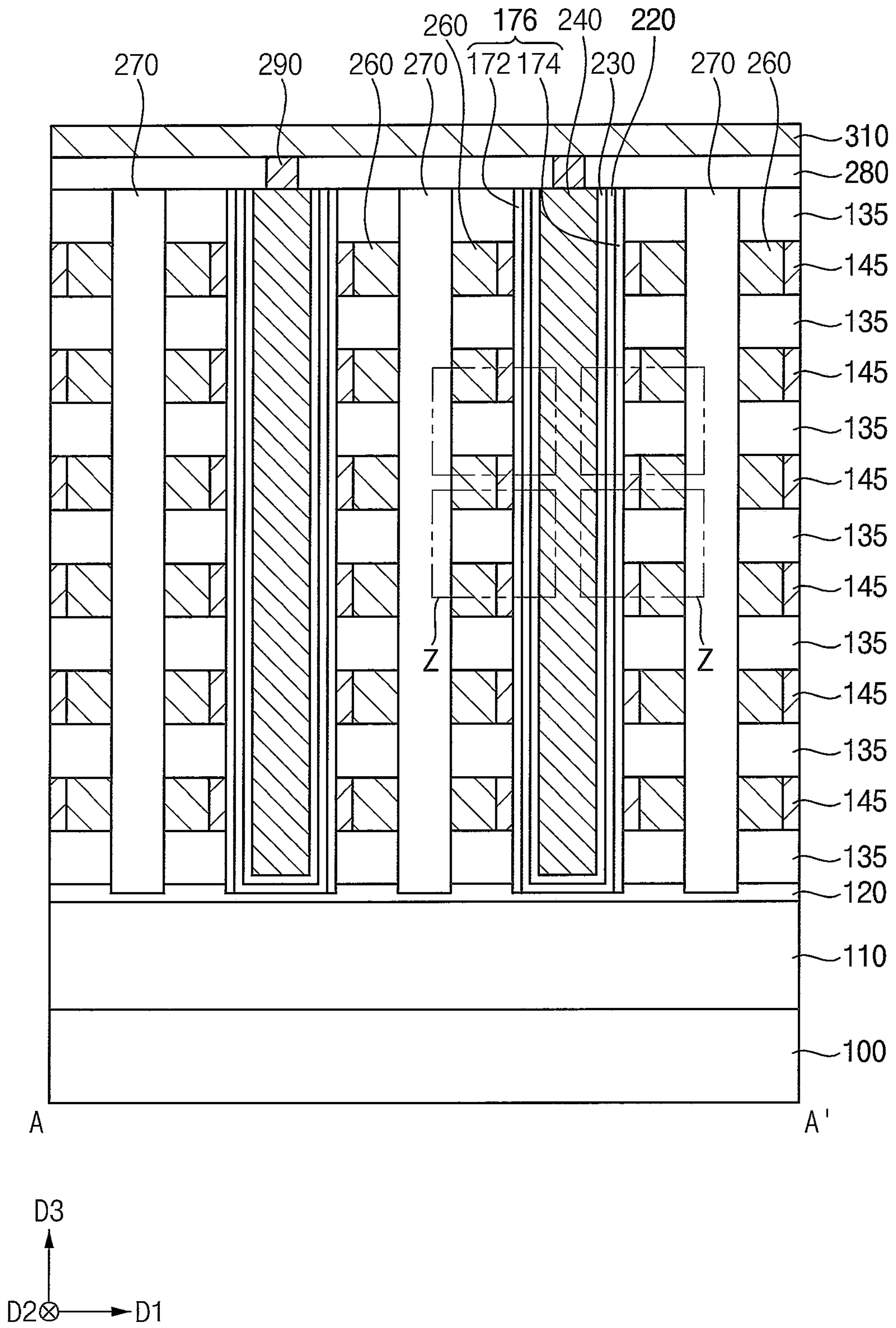

Referring to FIG. 26, a unit cell of the 3D FeRAM device may be formed in a region Z.

According to an embodiment, the second insulation layer 190 dividing each of the multi-layered structures in the third direction D3 may not be formed, and the source/drain pattern structures stacked in the third direction D3 may alternately serve as source and drain from a lowermost level toward an uppermost level.

Figure 27:
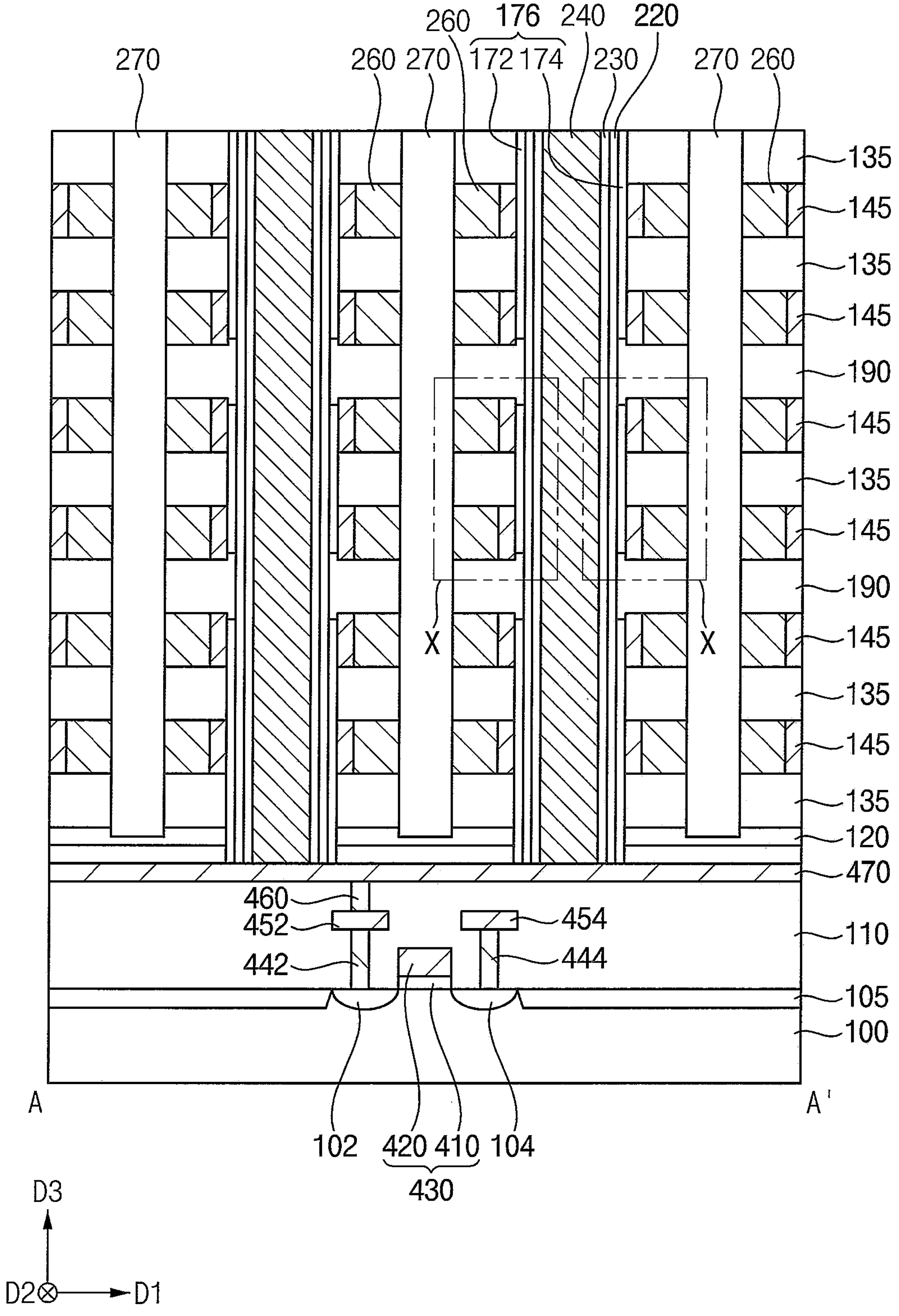

Referring to FIG. 27, the 3D FeRAM device may include a lower circuit pattern in the first insulating interlayer 110 on the first substrate 100, and thus, may have a cell over periphery (COP) structure.

In an example embodiment, the lower circuit pattern may include a transistor, second to fourth contact plugs 442, 444 and 460, and second to fourth wirings 452, 454 and 470.

The transistor may include a gate structure on an active pattern of which a sidewall may be covered by an isolation pattern 105 on the first substrate 100, and first and second impurity regions 102 and 104 at upper portions, respectively, of the active pattern adjacent to the gate structure. The gate structure may include a fourth gate insulation pattern 410 and a third gate electrode 420 stacked in the third direction D3, and the first and second impurity regions 102 and 104 may serve as source and drain, respectively.

The second and third contact plugs 442 and 444 may contact upper surfaces of the first and second impurity regions 102 and 104, respectively, and the second and third wirings 452 and 454 may contact upper surfaces of the second and third contact plugs 442 and 444, respectively. The fourth contact plug 460 may contact an upper surface of the second wiring 452, and the fourth wiring 470 may contact an upper surface of the fourth contact plug 460.

According to an example embodiment, the fourth wiring 470 may be electrically connected to a plurality of first gate electrodes 240 arranged in the first direction D1, and may serve as a word line. The transistor may be electrically connected to the fourth wiring 470 through the second and fourth contact plugs 442 and 460 and the second wiring 452, and may serve as a gate selection transistor.

Figure 28:
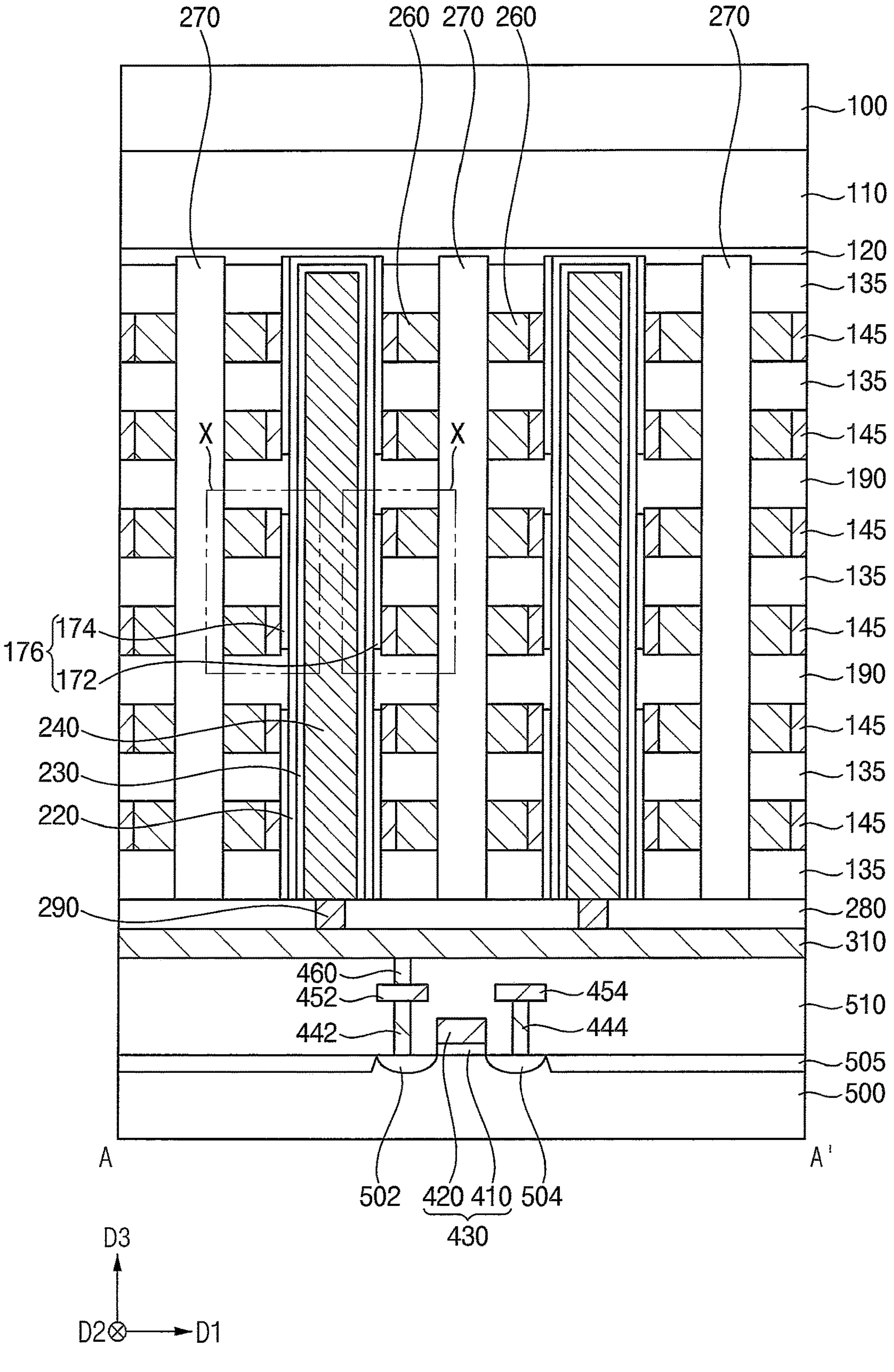

Referring to FIG. 28, the 3D FeRAM device may include a lower circuit pattern in a fourth insulating interlayer 510 on a second substrate 500, and the structures illustrated with reference to FIGS. 1 and 2 may be overturned, and may be formed on the second substrate 500.

Thus, the gate selection transistor on the second substrate 500 may be electrically connected to the first wiring 310 through the second and fourth contact plugs 442 and 460 and the second wiring 460.

A gate structure included in the gate selection transistor may be formed on an active pattern in an isolation pattern 505 on the second substrate 500, and first and second impurity regions 502 and 504 may be formed at upper portions of the active pattern adjacent to the gate structure.

While the disclosure has been shown and described with reference to example embodiments thereof, it will be apparent to those of ordinary skill in the art that various modifications in form and details may be made thereto without departing from the spirit and scope of the disclosure as set forth by the following claims.

What is claimed is:

1. A three-dimensional ferroelectric random access memory (3D FeRAM) device comprising:
- a first gate electrode extending in a vertical direction on a substrate;
- a ferroelectric pattern and a gate insulation pattern stacked on the first gate electrode in a first horizontal direction to surround the first gate electrode;
- first and second channels spaced apart from each other by an insulation layer in the first horizontal direction on an outer sidewall of the first gate insulation pattern;
- first source/drain pattern structures spaced apart from each other in the vertical direction on an outer sidewall of the first channel; and
- second source/drain pattern structures spaced apart from each other in the vertical direction on an outer sidewall of the second channel.

2. The 3D FeRAM device of claim 1, wherein the first gate electrode is one of a plurality of first gate electrodes arranged in a second horizontal direction crossing the first horizontal direction, the plurality of first gate electrodes forming a first gate electrode column, and the ferroelectric pattern, the gate insulation pattern and the first and second channels are formed on a sidewall of each of the plurality of first gate electrodes included in the first gate electrode column,
- wherein each of the first source/drain pattern structures extends in the second horizontal direction, and contacts outer sidewalls of the first channels arranged in the second horizontal direction, and
- wherein each of the second source/drain pattern structures extends in the second horizontal direction, and contacts outer sidewalls of the second channels arranged in the second horizontal direction.

3. The 3D FeRAM device of claim 2, wherein the first and second channels are spaced apart from each other in the first horizontal direction.

4. The 3D FeRAM device of claim 3, wherein the first gate electrode column is one of a plurality of first gate electrode columns spaced apart from each other in the first horizontal direction, the plurality of first gate electrode columns forming a first gate electrode array, and
- wherein the 3D FeRAM further comprises a word line extending in the first horizontal direction, the word line being electrically connected to ones of the plurality of first gate electrodes arranged in the first horizontal direction included in the first gate electrode array.

5. The 3D FeRAM device of claim 3, wherein each of the first source/drain pattern structures comprises:
- a first source/drain pattern contacting the outer sidewalls of the first channels; and
- a second source/drain pattern contacting a sidewall of the first source/drain pattern in the first horizontal direction, and
- wherein each of the second source/drain pattern structures comprises:
  - a third source/drain pattern contacting the outer sidewalls of the second channels; and
  - a fourth source/drain pattern contacting a sidewall of the third source/drain pattern in the first horizontal direction.

6. The 3D FeRAM device of claim 5, wherein each of the first and third source/drain patterns comprises doped polysilicon, and each of the second and fourth source/drain patterns comprises a metal.

7. The 3D FeRAM device of claim 1, further comprising a second gate electrode between the ferroelectric pattern and the gate insulation pattern.

8. The 3D FeRAM device of claim 7, wherein each of the first and second gate electrodes comprises a metal.

9. The 3D FeRAM device of claim 7, wherein the ferroelectric pattern extends in the vertical direction, and
- wherein the second gate electrode is one of a plurality of second gate electrodes spaced apart from each other in the vertical direction.

10. The 3D FeRAM device of claim 9, wherein the gate insulation pattern is one of a plurality of gate insulation patterns spaced apart from each other in the vertical direction, and the plurality of gate insulation patterns contact the plurality of second gate electrodes, respectively.

11. The 3D FeRAM device of claim 10,
- wherein the third first channel is one of a plurality of first channels spaced apart from each other in the vertical direction, and the plurality of first channels contact the plurality of gate insulation patterns, respectively, and
- wherein the second channel is one of a plurality of second channels spaced apart from each other in the vertical direction, and the plurality of second channels contact the plurality of gate insulation patterns, respectively.

12. The 3D FeRAM device of claim 1, wherein each of the ferroelectric pattern and the gate insulation pattern extends in the vertical direction, and
- wherein the first channel is one of a plurality of first channels spaced apart from each other in the vertical direction, and the second channel is one of a plurality of second channels spaced apart from each other in the vertical direction.

13. The 3D FeRAM device of claim 1, wherein each of the first and second channels comprises polysilicon.

14. The 3D FeRAM device of claim 1, wherein each of the first and second channels comprises an oxide semiconductor material.

15. The 3D FeRAM device of claim 1, wherein each of the first and second channels comprise a two-dimensional material.

16. A three-dimensional ferroelectric random access memory (3D FeRAM) device comprising:

a first gate electrode on a substrate, the first gate electrode extending in a vertical direction substantially perpendicular to an upper surface of the substrate;

a ferroelectric pattern, a second gate electrode and a gate insulation pattern sequentially stacked on the first gate electrode in a horizontal direction to surround the first gate electrode;

a first channel and a second channel spaced apart from each other by an insulation layer in the horizontal direction on an outer sidewall of the gate insulation pattern;

first source/drain pattern structures spaced apart from each other in the vertical direction on an outer sidewall of the first channel; and second source/drain pattern structures spaced apart from each other in the vertical direction on an outer sidewall of the second channel.

17. The 3D FeRAM device of claim 16, wherein each of the first and second gate electrodes comprises a metal.

18. The 3D FeRAM device of claim 16, wherein the ferroelectric pattern extends in the vertical direction, wherein the second gate electrode is one of a plurality of second gate electrodes spaced apart from each other in the vertical direction, wherein the gate insulation pattern is one of a plurality of gate insulation patterns spaced apart from each other in the vertical direction, the plurality of gate insulation patterns contacting the plurality of second gate electrodes, respectively, wherein the first channel is one of a plurality of first channels spaced apart from each other in the vertical direction, the plurality of first channels contacting the plurality of gate insulation patterns, respectively, and wherein the second channel is one of a plurality of second channels spaced apart from each other in the vertical direction contacting the plurality of gate insulation patterns, respectively.

19. A three-dimensional ferroelectric random access memory (3D FeRAM) device comprising:

gate electrodes spaced apart from each other in first and second horizontal directions on a substrate, the first and second horizontal directions crossing each other, and each of the gate electrodes extending in a vertical direction;

ferroelectric patterns surrounding the gate electrodes, respectively;

gate insulation patterns surrounding the ferroelectric patterns, respectively;

first and second channels on an outer sidewall of each of the gate insulation patterns, the first and second channels being spaced apart from each other by an insulation layer in the first horizontal direction;

a first source/drain pattern structure extending in the second horizontal direction and comprising:

a first source/drain pattern contacting outer sidewalls of ones of the first channels arranged in the second horizontal direction; and a second source/drain pattern contacting a sidewall of the first source/drain pattern in the first horizontal direction;

a second source/drain pattern structure extending in the second horizontal direction and comprising:

a third source/drain pattern contacting outer sidewalls of ones of the second channels arranged in the second horizontal direction; and a fourth source/drain pattern contacting a sidewall of the third source/drain pattern in the first horizontal direction; and a word line extending in the first horizontal direction, the word line being electrically connected to ones of the gate electrodes arranged in the first horizontal direction.

20. The 3D FeRAM device of claim 19, wherein the first and second channels are spaced apart from each other in the first horizontal direction.

* * * * *